(12) United States Patent
Bettenwort et al.

(10) Patent No.: US 11,558,011 B2
(45) Date of Patent: Jan. 17, 2023

(54) METHOD AND DEVICE FOR RECOGNISING FAULTS IN A PHOTOVOLTAIC (PV) GENERATOR

(71) Applicant: SMA Solar Technology AG, Niestetal (DE)

(72) Inventors: Gerd Bettenwort, Kassel (DE); Christopher Merz, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 927 days.

(21) Appl. No.: 15/982,412

(22) Filed: May 17, 2018

(65) Prior Publication Data
US 2018/0269688 A1 Sep. 20, 2018

Related U.S. Application Data

(63) Continuation of application No. PCT/EP2016/077979, filed on Nov. 17, 2016.

(30) Foreign Application Priority Data

Nov. 17, 2015 (DE) ............. 10 2015 119 846.0

(51) Int. Cl.
| | | |
|---|---|---|
| *H02J 3/38* | (2006.01) | |
| *H02S 50/10* | (2014.01) | |
| *H02S 50/00* | (2014.01) | |
| *H01L 31/02* | (2006.01) | |

(52) U.S. Cl.
CPC ........ *H02S 50/00* (2013.01); *H01L 31/02021* (2013.01); *H02S 50/10* (2014.12)

(58) Field of Classification Search
CPC ................................ H02S 50/00; H02S 50/10
See application file for complete search history.

(56) References Cited

U.S. PATENT DOCUMENTS

| | | | |
|---|---|---|---|
| 8,138,411 B2 * | 3/2012 | Beck ................. | H01L 31/02021 136/244 |
| 8,158,877 B2 | 4/2012 | Klein et al. | |
| 8,239,149 B2 * | 8/2012 | Nuotio ................... | H02S 50/10 702/65 |
| 2010/0332167 A1 | 12/2010 | Nuotio | |
| 2012/0247542 A1 | 10/2012 | Ammer | |

(Continued)

FOREIGN PATENT DOCUMENTS

| | | |
|---|---|---|
| CN | 103744465 B | 4/2014 |
| EP | 2019433 A1 | 1/2009 |

(Continued)

OTHER PUBLICATIONS

International Search Report dated Feb. 17, 2017 for International Application PCT/EP2016/077979.

(Continued)

*Primary Examiner* — Walter L Lindsay, Jr.
*Assistant Examiner* — Milton Gonzalez
(74) *Attorney, Agent, or Firm* — Eschweiler & Potashnik, LLC

(57) ABSTRACT

A method for detecting a potential-induced degradation (PID) of PV modules of a PV installation includes operating a PV generator at a maximum power point (MPP), at a first generator voltage ($U_1$) and first generator current ($I_1$), and at a second generator voltage ($U_2$) and second generator current ($I_2$), where a first power ($P_1$) at the first generator voltage ($U_1$) is in a predefined first ratio $V_1 = P_1/P_{MPP}$ and $V_1 \leq 1$, with the power ($P_{MPP}$) at the maximum power point (MPP) of the PV generator, and where a second power ($P_2$) at the second generator voltage ($U_2$) is in a predefined second ratio $V_2 = P_2/P_1$ and $V_2 < 1$, with the first power ($P_1$) of the PV generator, and where a quantity Y that characterizes a progress of the potential-induced degradation (PID) is determined from the values of the voltages ($U_1$, $U_2$) and/or the currents ($I_1$, $I_2$).

21 Claims, 13 Drawing Sheets

(56) References Cited

U.S. PATENT DOCUMENTS

| | | | |
|---|---|---|---|
| 2012/0296584 A1* | 11/2012 | Itoh | G05F 1/67 |
| | | | 702/58 |
| 2013/0027997 A1* | 1/2013 | Tan | H02M 7/48 |
| | | | 363/95 |
| 2013/0082724 A1* | 4/2013 | Noda | H02S 50/10 |
| | | | 324/750.01 |
| 2014/0070815 A1 | 4/2014 | Liu | |
| 2015/0094967 A1 | 4/2015 | Kouno et al. | |
| 2015/0185272 A1* | 7/2015 | Oberzaucher | G01R 31/12 |
| | | | 324/761.01 |

FOREIGN PATENT DOCUMENTS

| | | |
|---|---|---|
| JP | 2003121490 A | 4/2003 |
| JP | 2008091807 A | 4/2008 |
| JP | 2012186409 A | 9/2012 |
| KR | 101458363 B1 | 11/2014 |
| WO | 2014081695 A1 | 5/2014 |

OTHER PUBLICATIONS

National Instruments; Part II—Photovoltaic Cell I-V Characteristics Theory and LabVIEW Analysis Code; May 10, 2012, Tutorial; www.ni.com/white-paper/7230/en.
Pingel S. et al; "Potential Induced Degradation of Solar Cells and Panels"; Solon SE; Berlin, Germany; 2010 35th IEEE Photovoltaic Specialists Conference, 2010, 2817-2822.-ISSN 0160-8371.

* cited by examiner

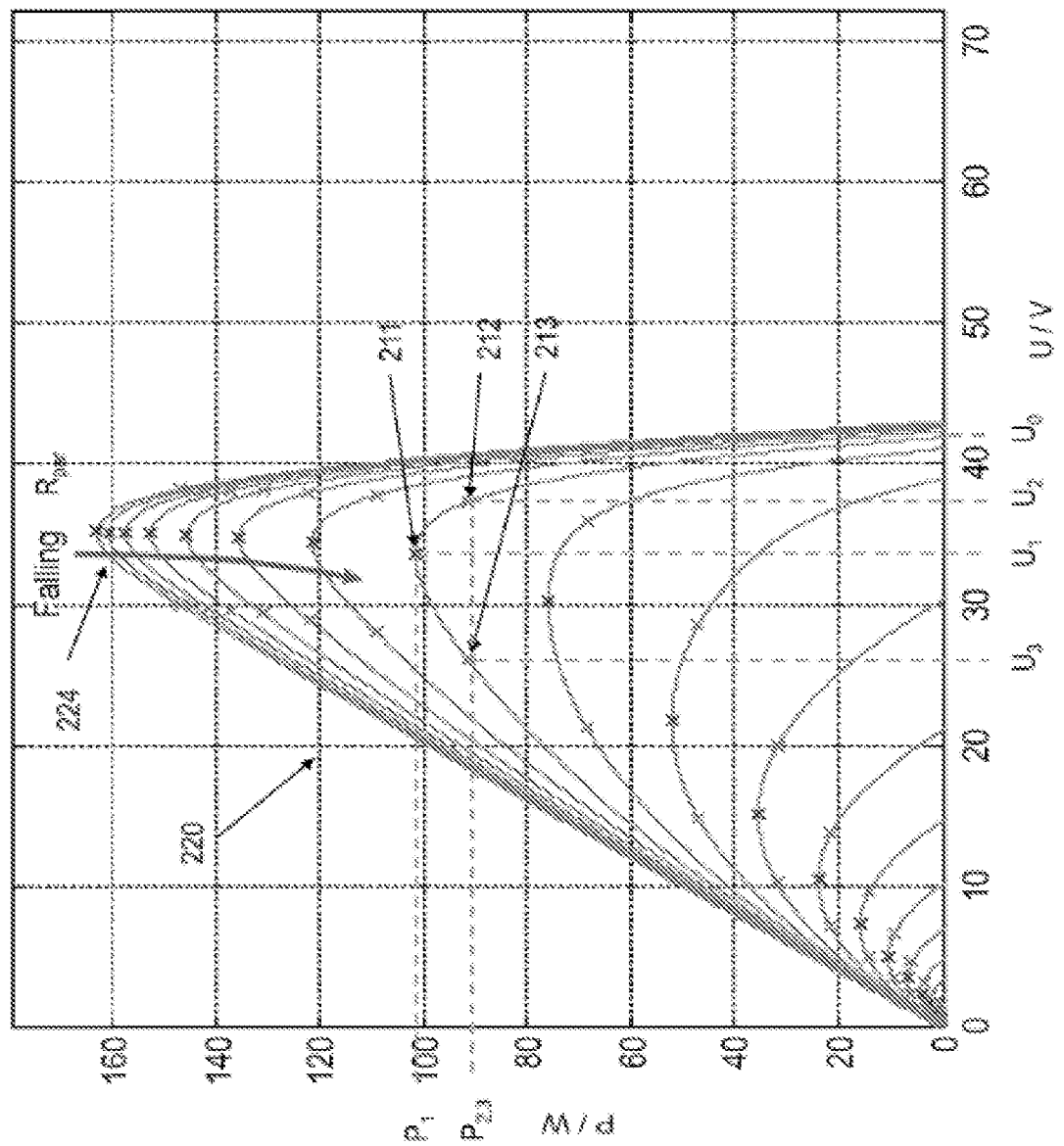

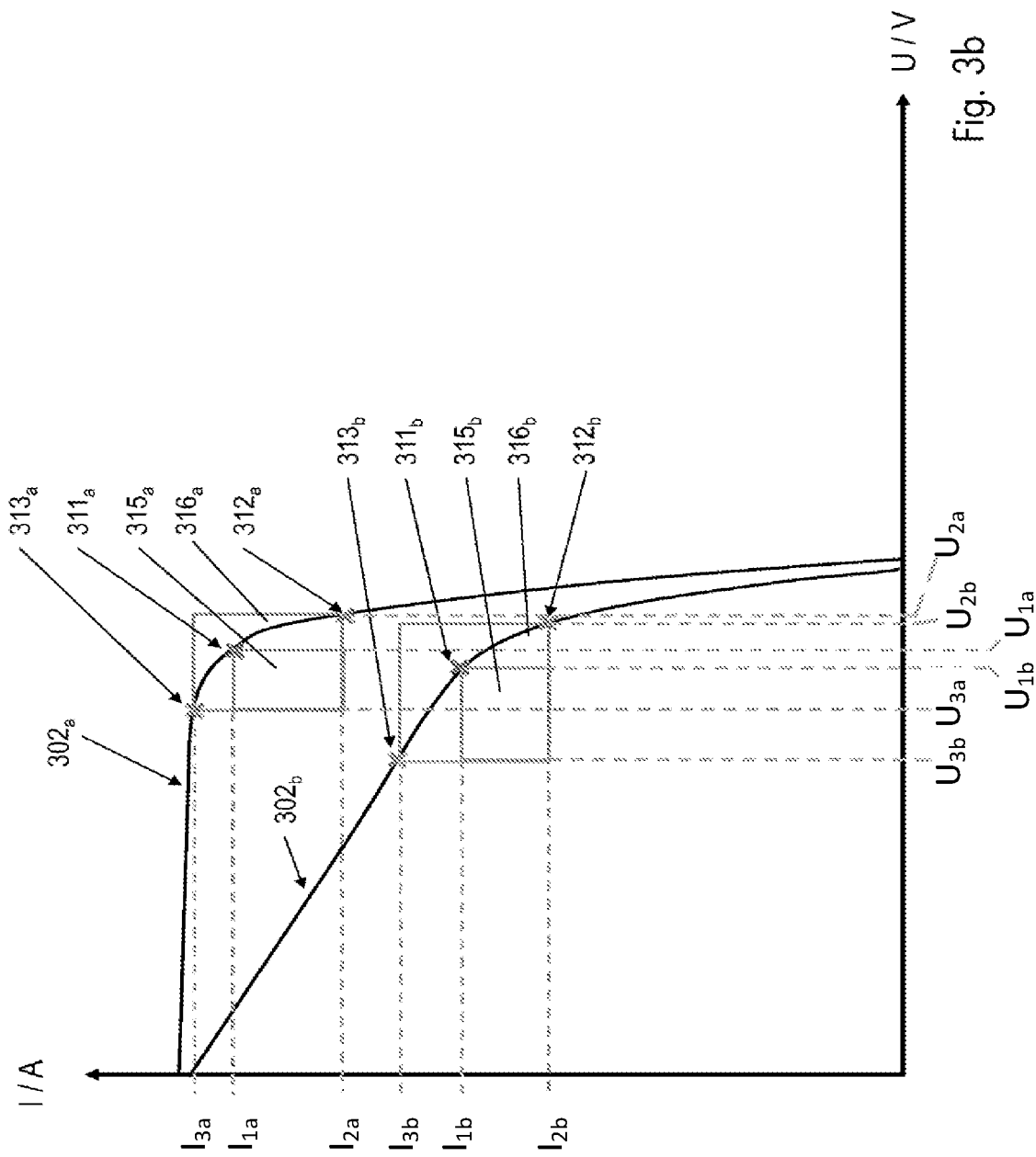

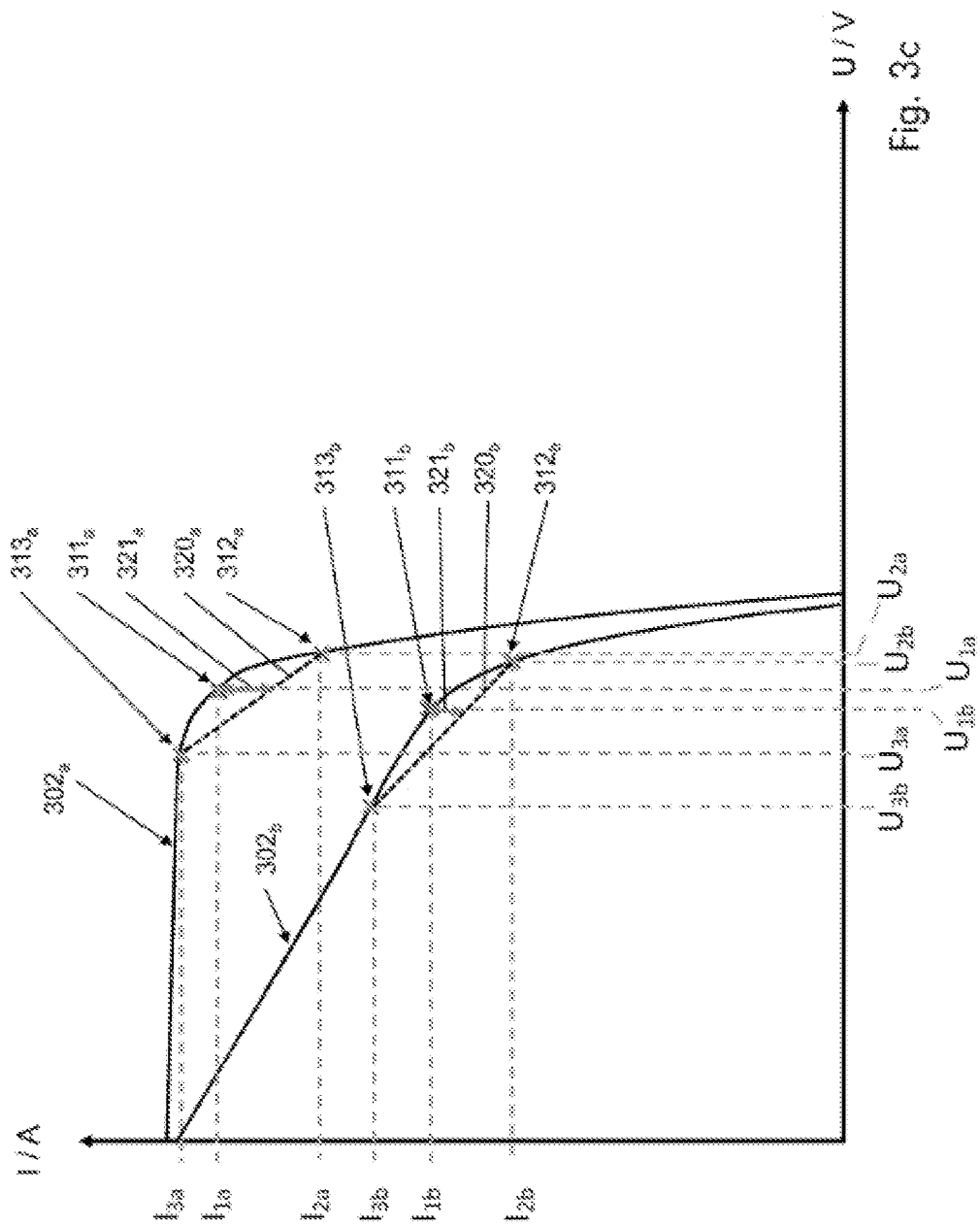

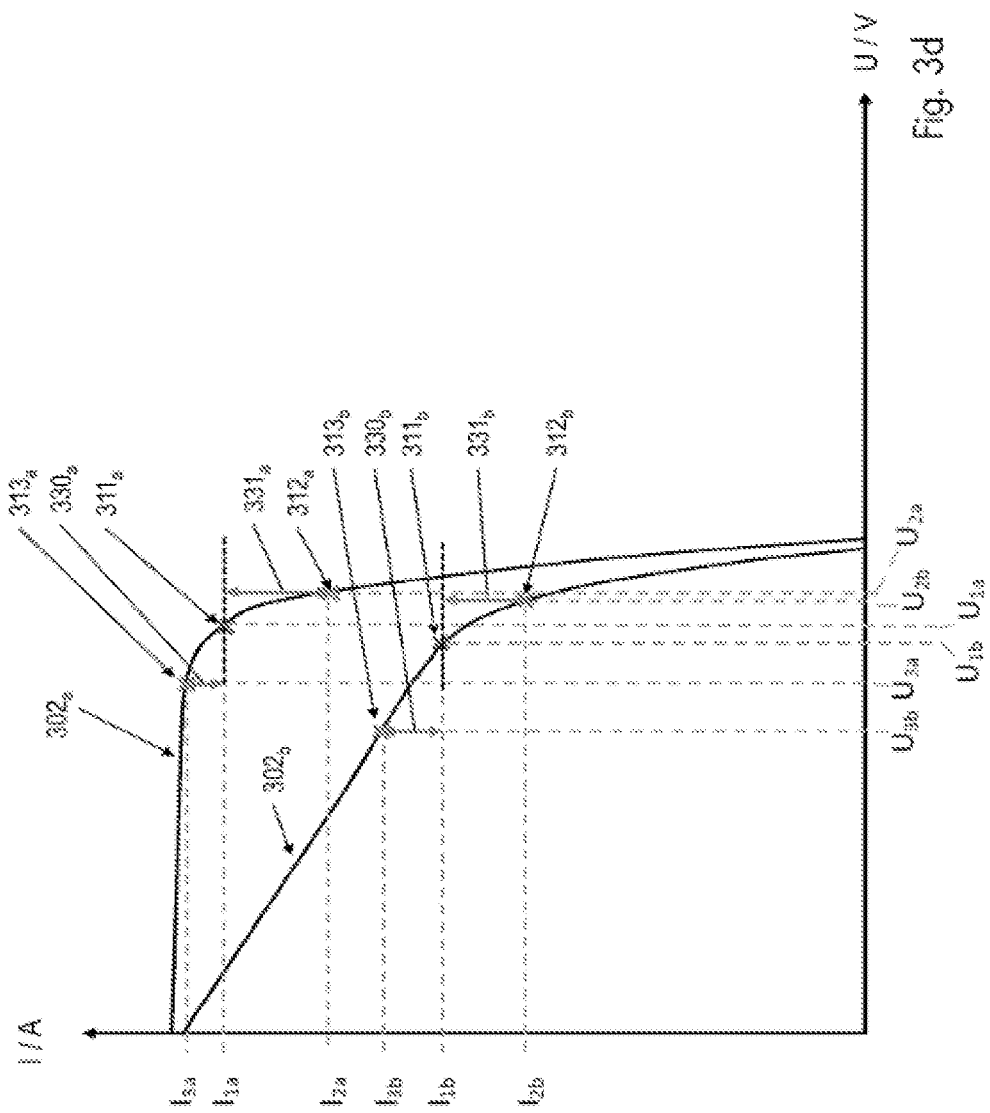

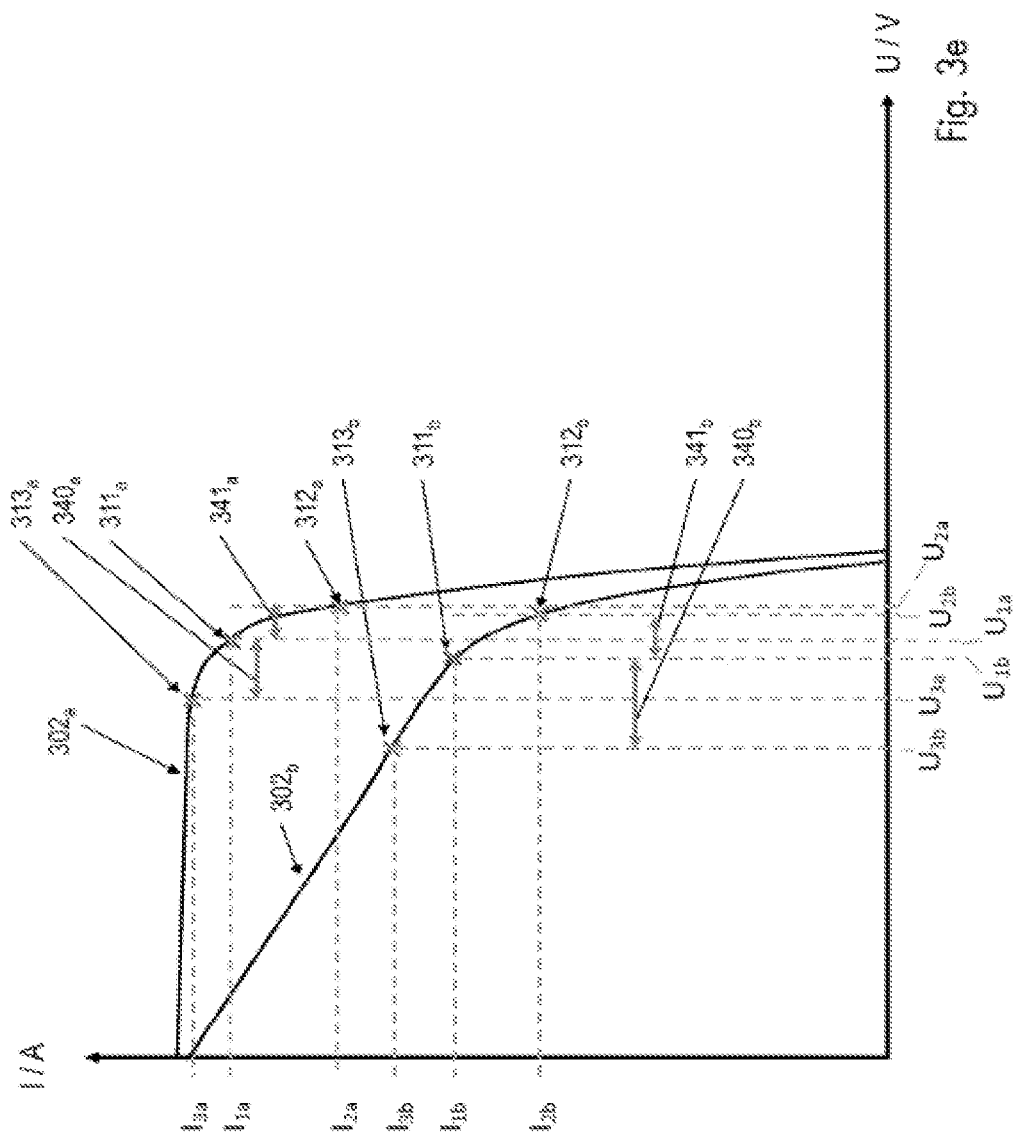

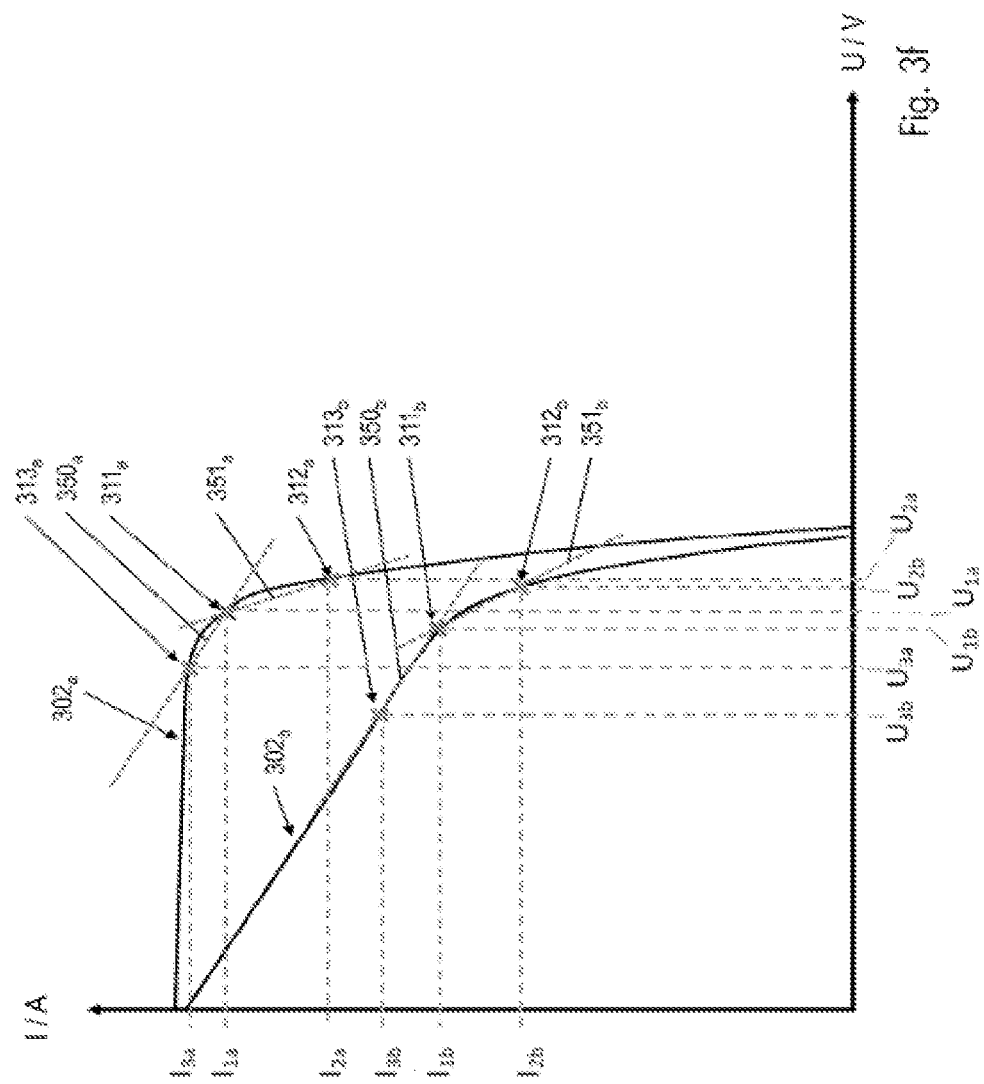

METHOD AND DEVICE FOR RECOGNISING FAULTS IN A PHOTOVOLTAIC (PV) GENERATOR

CROSS REFERENCE TO RELATED APPLICATIONS

This application is a continuation of International Patent Application number PCT/EP2016/077979, filed on Nov. 17, 2016, which claims priority to German Patent Application number 10 2015 119 846.0, filed on Nov. 17, 2015, and is hereby incorporated by reference in its entirety.

FIELD

The disclosure relates to a method for detecting a potential-induced degradation (PID) of photovoltaic (PV) modules of a PV installation.

BACKGROUND

A potential-induced degradation (PID) of PV modules is understood to mean damage to the PV modules that progresses often slowly and unnoticed over time. This involves the PV modules being damaged such that their maximum power decreases as the degree of damage increases. If the potential-induced degradation is detected early on, then damaged PV modules can be fixed again at least to a certain degree by means of suitable measures, e.g. shifting a generator potential of the PV modules relative to a ground potential PE. Often, the potential-induced degradation is not detected, but at least not detected early on, on account of its subtly progressive character. Therefore, irreversible damage to the PV modules normally occurs that shortens the life of said PV modules. During the life of the PV modules, which is shortened anyway, the efficiency of a PV installation having the damaged PV modules additionally decreases. It is therefore desirable to detect a progressive potential-induced degradation of PV modules of a PV installation as early as possible.

EP 2019433 A1 discloses an apparatus for fault diagnosis on a photovoltaic unit. The apparatus includes a measuring unit for measuring a current/voltage characteristic of the photovoltaic unit. A conversion unit converts the current/voltage characteristic measured by the measuring unit into a standardized current/voltage characteristic under predefined standard conditions. The apparatus moreover includes a memory for storing a multiplicity of reference characteristics and an evaluation unit for comparing the converted current/voltage characteristic with the stored reference characteristics and for determining with which of the reference characteristics the current/voltage characteristic is most concordant. For the conversion into the standardized current/voltage characteristic under predefined standard conditions, the apparatus requires additional sensors for detecting present ambient conditions, in particular temperature sensors and sensors for measuring the radiation intensity.

The internet page http://www.ni.com/white-paper/7230/en/ provides an overview of theoretical correlations in regard to a current/voltage characteristic of a photovoltaic cell.

The specification JP2008091807A discloses an apparatus that can be used to detect faults in the solar cell arrangement and to ascertain the cause thereof. A matching circuit is used to set a reference output voltage on the solar cell arrangement and to measure the current corresponding to the reference output voltage. Additionally, the matching circuit can be used to set a reference current for the solar cell arrangement and to ascertain the output voltage associated with the reference current.

The document JP2012186409A discloses an apparatus for determining a shadowed state of a solar cell arrangement. First of all, a reference current/voltage characteristic is computed from values of no-load voltage, short-circuit current, MPP voltage and MPP current. A comparison of a current/voltage characteristic measured during operation of the solar cell arrangement with the reference current/voltage characteristic is used to ascertain a shadowed state.

The specification from JP2003121490A discloses a method for determining characteristic parameters, such as no-load voltage or series resistance, from a current/voltage characteristic of a solar cell. The method involves those measured data that allow as accurate as possible a linear approximation of the current/voltage characteristic in the respective range being extracted independently of the number and interval of the measured current/voltage data.

The document AT508834A1 discloses a method and an apparatus for fault detection in a photovoltaic (PV) installation. This involves a first output voltage ($U_0$, $U_{MPP}$) of the PV installation being ascertained in the first operating state at a first time. At a second time, a second output voltage ($U_0$, $U_{MPP}$) of the PV installation is ascertained in a second operating state, which is comparable with the first operating state. Finally, a disparity between the first and second output voltages ($U_0$, $U_{MPP}$) is ascertained and a fault report is output if the disparity exceeds a prescribed threshold value.

SUMMARY

A method according to the disclosure for detecting a potential-induced degradation (PID) of PV modules of a PV installation has a measurement pass. The method comprises operating a PV generator of the PV installation at a maximum power point (MPP) with values of generator voltage ($U_{MPP}$) and generator current ($I_{MPP}$) associated with the maximum power point (MPP), and operating the PV generator of the PV installation at a first generator voltage ($U_1$) and detection of a first generator current ($I_1$) associated with the first generator voltage ($U_1$). The method further comprises operating the PV generator of the PV installation additionally at a second generator voltage ($U_2$) and detection of a second generator current ($I_2$) associated with the second generator voltage ($U_2$). In the method, the first generator voltage ($U_1$) is chosen such that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \leq 1$, with the power ($P_{MPP}$) at the maximum power point (MPP) of the PV generator. The second generator voltage ($U_2$) is chosen such that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator. A characteristic quantity Y characterizing a progress of the potential-induced degradation (PID) is determined from the ascertained values of the first and second generator voltages ($U_1$, $U_2$) and/or the first and second generator currents ($I_1$, $I_2$).

Within the context of the disclosure, the term "progress of the potential-induced degradation" can at the same time also be understood as a "degree of the potential-induced degradation". It is thus possible for the measurement pass on an individual PV generator of the PV installation to be repeated at different times—for example daily, weekly or monthly—and for the characteristic quantity Y to be determined and stored for each measurement pass. A comparison of the currently determined characteristic quantity Y with previously determined characteristic quantities Y of the same PV generator allows both the trend—and hence also the progress or the present degree of damage—of the potential-induced degradation of the PV modules to be described.

The PV generator may firstly be the entire PV generator of the PV installation. This is the case particularly if the PV installation has a PV inverter having just one DC input for connecting just one PV generator. The PV generator within the context of the application may alternatively be just a PV generator element of a PV generator having multiple PV generator elements. This is the case, for example, if the PV installation has a multistring inverter as PV inverter. In this situation, the multistring inverter has multiple DC inputs, each for connecting a PV generator element. In this case, the different PV generator elements can be controlled independently of one another and also MPP tracking of the individual PV generator elements can be effected independently of one another.

The method involves the first power being set in a predefined first ratio relative to a characteristic reference point, namely the maximum power point (MPP) of the PV generator. Since the second power is set in a predefined second ratio to the first power, the second power is also implicitly set in a predefined ratio relative to the maximum power point of the PV generator. In this situation, the first power may be either less than or equal to the power at the maximum power point of the PV generator. The second power is by contrast reduced relative to the power of the maximum power point of the PV generator—and in particular also relative to the first power of the PV generator. The values of first and second generator currents and first and second generator voltages that are associated with the first and second powers are obtained from the power specification and the currently prevailing ambient conditions, such as insolation and temperature. In this situation, it is irrelevant whether the second generator voltage $U_2$ is lower or higher than the first generator voltage $U_1$.

The method uses the insight that when a first operating point associated with the first power and a second operating point associated with the second power are chosen in this way, the characteristic quantity Y is extremely largely independent of—but at least not significantly dependent on—possibly fluctuating ambient conditions. Only during performance of a measurement pass for determining the characteristic quantity Y should there be approximately constant ambient conditions prevailing, in particular in respect of incident radiation and temperature. By contrast, a change in the ambient conditions during temporally successive measurement passes can certainly take place, without this having any significant influence on the ascertained characteristic quantity Y. Such measurement of the potential-induced degradation can therefore take place without sensors for capturing the present temperature and incident radiation. Rather, the method uses sensors, for example current and voltage sensors, which are present anyway in suitable PV inverters. With currently available PV inverters, a control apparatus of the PV inverter is also typically capable of operating a PV generator connected to the PV inverter—and hence the PV installation—at an operating point having reduced power relative to the power associated with the (MPP) maximum power point of the PV installation. The method can therefore be easily and inexpensively integrated into commercially available PV inverters. In the method, the second and optionally also the first power of the PV generator is reduced in comparison with the power at the MPP maximum power point of the PV generator. The required reduction is dependent on an accuracy of the current and voltage sensors used. The more accurately the current and voltage sensors used are designed, the smaller the power reduction, required for determining the characteristic quantity Y, relative to the power at the maximum power point of the PV generator. When currently available current and voltage sensors are used, the reduced power is no more than 60%, no more than 80%, possibly no more than 90% but at most no more than 95% relative to the power at the (MPP) maximum power point of the PV generator. During the method for detecting a potential-induced degradation of PV modules of a PV installation, the PV generator of the PV installation operates with only slight limiting, and this is also just for a period during the respective measurement pass or during the respective measurement passes. The method thus has just a minor, and normally negligible, influence on an electric power fed into the system by the PV installation. In other words, the electric power fed into the system by the PV installation is not significantly reduced during performance of the method relative to a comparable PV installation that does not use the method, however, and continually operates at the maximum power point.

In an advantageous embodiment of the method, the PV generator of the PV installation is additionally operated at a third generator voltage ($U_3$) and a third generator current ($I_3$) associated with the third generator voltage ($U_3$) is detected. In this situation, the third generator voltage ($U_3$) is chosen such that a third power ($P_3$), with $P_3=U_3*I_3$, of the PV generator at the third generator voltage ($U_3$) is in a predefined third ratio ($V_3$), with $V_3=P_3/P_1$ and $V_3<1$, with the first power ($P_1$) of the PV generator, and a relationship in the form ($U_3<U_1<U_2$) or a relationship in the form ($U_2<U_1<U_3$) applies to the generator voltages ($U_1$, $U_2$, $U_3$) in accordance with their values. In this case, the characteristic quantity Y characterizing the progress of the potential-induced degradation is determined from the values of the first, the second and the third generator voltage ($U_1$, $U_2$, $U_3$) and/or the first, the second and the third generator current ($I_1$, $I_2$, $I_3$). The first generator voltage $U_1$ is in this case always arranged between the values of the second generator voltage $U_2$ and the third generator voltage $U_3$. It is irrelevant, however, whether the second generator voltage $U_2$ is lower or higher than the third generator voltage $U_3$ here.

In one embodiment of the method for detecting a potential-induced degradation of PV modules of a PV installation, the third power ($P_3$) of the PV generator at the third generator voltage ($U_3$) is equal to the second power ($P_2$) of the PV generator at the second generator voltage ($U_2$).

In an advantageous embodiment of the method for detecting a potential-induced degradation of PV modules of a PV installation, during the performance of an individual measurement pass a check is performed to determine whether the ambient conditions of the PV generator—in particular incident radiation and temperature—are sufficiently constant. For this purpose, during a measurement pass a first approach and, with staggered timing from the first approach to the respective generator voltage ($U_1$, $U_2$, $U_3$), a further approach are effected for one of the generator voltages ($U_1$, $U_2$, $U_3$). The further approach to the respective generator voltage ($U_1$, $U_2$, $U_3$) also results in a further generator current ($I_{1,2}$, $I_{2,2}$, $I_{3,2}$) being detected. The values of the further generator current ($I_{1,2}$, $I_{2,2}$, $I_{3,2}$) are now compared with the applicable values of the generator current ($I_1$, $I_2$, $I_3$) for the first approach to the respective generator voltage ($U_1$, $U_2$, $U_3$). In this situation, the applicable measurement pass is used to determine the characteristic quantity Y only if an absolute value of a difference between the generator current ($I_1$, $I_2$, $I_3$) and the further generator current ($I_{1,2}$, $I_{2,2}$, $I_{3,2}$) is below a predefined threshold value AI. If this is the case, then the respective values of the generator current ($I_1$, $I_2$, $I_3$) are sufficiently similar to the applicable values of the further generator current ($I_{1,2}$, $I_{2,2}$, $I_{3,2}$). As a result, it is detected whether or not an arbitrarily but firmly chosen operating point on the current/voltage characteristic of the PV generator changes during a measurement pass. A change in the operating point is an indication that the ambient conditions of the PV generator have changed significantly during the measurement pass. In the event of ambient conditions changing during a measurement pass, a determination of the characteristic quantity Y would result in incorrect values. To avoid this, the measurement pass is used to determine the characteristic quantity Y only if there is a sufficient reproducibility or similarity of the respective generator currents ($I_1$, $I_2$, $I_3$) and the further generator currents ($I_{1,2}$, $I_{2,2}$, $I_{3,2}$). If this is the case, sufficiently constant ambient conditions can be assumed during the measurement pass.

Advantageously, the first approach to one of the generator voltages ($U_1$, $U_2$, $U_3$) is effected at the beginning of the measurement pass, and the further approach to the respective generator voltage ($U_1$, $U_2$, $U_3$) is effected at the end of the measurement pass. This makes certain with sufficient accuracy that there are constant ambient conditions in respect of incident radiation and temperature for the period of performance of the measurement pass. During the performance of the measurement pass, individual generator voltages ($U_1$, $U_2$, $U_3$) can also be approached more than just twice. A third—possibly even a fourth—approach to individual generator voltages allows early detection of whether a change in the ambient conditions has occurred during the measurement pass. In this case, the measurement pass can actually be terminated early.

In a further embodiment of the method for detecting a potential-induced degradation of PV modules of a PV installation, the first generator voltage ($U_1$) is chosen such that it denotes a maximum power point of the PV generator of the PV installation (MPP). This allows the limiting of the PV installation that is required during the performance of the measurement pass to be reduced even further and the electric power fed into the system by the PV installation comes even closer to the electric power that would be fed in if the PV generator of the PV installation were permanently operated at the maximum power point.

In one embodiment of the method for detecting a potential-induced degradation of PV modules of a PV installation, the determination of the characteristic quantity Y results in a curvature of the current/voltage characteristic and/or of the power/voltage characteristic at, but at least in proximity to, the maximum power point (MPP) of the PV generator being evaluated. The curvature of the current/voltage characteristic and the curvature of the power/voltage characteristic at the MPP operating point thus decreases as the degree of the potential-induced degradation increases. The method according to the disclosure involves this curvature or a measure of the curvature being evaluated on the basis of two or three discrete points in proximity to the MPP operating point. Hence, the method is likewise capable of analyzing not only a PID but also other degradation phenomena or effects that exert an influence on the curvature of the current/voltage characteristic and/or the power/voltage characteristic at, but at least in proximity to, the maximum point (MPP) of the PV generator.

A few advantageous parameters ($W_1$, $W_2$, $W_3$, $W_4$, $W_5$, $W_6$) suitable for evaluating the curvature—and hence for evaluating the characteristic quantity Y—are disclosed below. A detailed description and motivation for these parameters ($W_1$, $W_2$, $W_3$, $W_4$, $W_5$, $W_6$) is provided in a later section as part of the description of the figures for FIG. 3a-FIG. 3f.

In the description that follows, it is repeatedly stated that individual parameters each "take into consideration" a particular term that is a computation rule. In this situation, the term "take into consideration" firstly covers the respective parameter being the same as the particular term. Equally, however, the term "take into consideration" also covers the nonexhaustive case that the applicable parameter merely has the particular term. The applicable parameter can thus have not only the respectively included term but also further terms.

Relative Voltage Width

In one embodiment of the disclosure, the characteristic quantity Y is determined from a first parameter ($W_1$) that takes into consideration a relative voltage width $\Delta U = U_2 - U_3$ around the operating point at the power $P_1$ of the PV generator within a PU graph. In this situation, the term "PU graph" denotes, within the present application, a power/voltage graph. The relative voltage width is obtained from the second and third generator voltages $U_2$, $U_3$ on a power/voltage characteristic within the power/voltage graph from the prescribed values of the powers $P_1$, $P_2$, $P_3$. As shown in conjunction with the description pertaining to FIG. 3a, this voltage width around the operating point $P_1$ increases as the progress of the potential-induced degradation increases. Since the computation of the power also includes the generator current, a change of curvature of the current/voltage characteristic in the region of the operating point at the power $P_1$ also results in a characteristic widening of the power/voltage characteristic in the region of the operating point of the power $P_1$. Within the scope of the disclosure, and in order to use a dimensionless variable, it is possible to normalize the relative voltage width $\Delta U$ to the generator voltage $U_1$ and to use the ratio $(U_2 - U_3)/U_1$ as the first parameter $W_1$. Equally, it is possible to use a relative voltage width $(U_2 - U_3)/P_1$ normalized to the power $P_1$ as the first parameter $W_1$, which increases the sensitivity of the parameter $W_1$ again. A detailed computation rule and a graphical illustration of the first parameter $W_1$ are provided within the description of the figures, pertaining to FIG. 3a.

Discrete-Point Fill Factor FF:

In one embodiment of the method, the characteristic quantity Y is determined from a second parameter $W_2$ that takes into consideration a discrete-point fill factor FF within an IU graph. In this situation, the IU graph corresponds, within the present application, to a current/voltage graph. The parameter $W_2$—and hence the discrete-point fill factor FF—describes an area ratio of two rectangles whose corners are obtained from the values of the first, second and third generator voltages $U_1$, $U_2$, $U_3$ and the values of the first, second and third generator currents $I_1$, $I_2$, $I_3$ within the current/voltage graph. A detailed computation rule and a graphical illustration pertaining to the discrete-point fill factor FF are provided within the description of the figures pertaining to FIG. 3b. It is shown that as the progress of the potential-induced degradation increases, the discrete-point fill factor FF decreases.

Difference Between the First Generator Current $I_1$ and an Imaginary Straight Connecting Line In a further embodiment of the method, the characteristic quantity Y is determined from a third parameter $W_3$ that takes into consideration a difference between the first generator current $I_1$ and a point on an imaginary straight connecting line between the points $(U_2, I_2)$ and $(U_3, I_3)$ within the IU graph at the location of the first generator voltage $U_1$. As the degree of the potential-induced degradation increases, the difference between the first generator current $I_1$ and the imaginary connecting line decreases, since the current/voltage characteristic within the IU graph loses its characteristic curvature in proximity to the operating point of the power $P_1$ and comes ever closer to a linear profile. A detailed explanation in combination with a graphical illustration of the third parameter $W_3$ is provided within the description of the figures pertaining to FIG. 3c.

Asymmetry of the Current Differences

In a further embodiment of the method, the characteristic quantity Y is determined from a fourth parameter $W_4$ that takes into consideration a first current difference $(I_1-I_2)$, a second current difference $(I_3-I_1)$ or a ratio of the first and second current differences between the generator currents $(I_1, I_2, I_3)$ as per $(I_1-I_2)/(I_3-I_1)$ at the respective generator voltages $(U_1, U_2, U_3)$ within the IU graph. As described in the description of the figures pertaining to FIG. 3d, the first current difference $I_1-I_2$ between the generator currents, which is obtained from the first $I_1$ and the second $I_2$ generator current, decreases as the degree of the potential-induced degradation increases. By contrast, a second current difference $I_3-I_1$ between the generator currents, which is obtained from the third $I_3$ and the first $I_1$ generator current, initially increases and thereafter decreases again somewhat as the degree of the potential-induced degradation increases. As a result of this, the ratio of the first current difference to the second current difference as per $(I_1-I_2)/(I_3-I_1)$ decreases, and strives toward a value of one $((I_1-I_2)/(I_3-I_1)=1$ for severely advanced potential-induced degradation), as the degree of the potential-induced degradation increases.

Asymmetry of the Voltage Differences

In the further embodiment of the method, the characteristic quantity Y is determined from a fifth parameter $W_5$ that takes into consideration a first voltage difference $(U_2-U_1)$, a second voltage difference $(U_1-U_3)$ or a ratio of the first and second voltage differences between the generator voltages $(U_1, U_2, U_3)$ as per $(U_1-U_3)/(U_2-U_1)$ within the IU graph. As explained in detail in the description pertaining to FIG. 3e, the first voltage difference $(U_2-U_1)$, which is obtained from the second $U_2$ and the first $U_1$ generator voltage, initially increases slightly and then decreases again as the degree of the potential-induced degradation increases. The second voltage difference $(U_1-U_3)$, which is obtained from the third $U_3$ and the first $U_1$ generator voltage, likewise initially increases, to decrease again as time progresses, as the degree of the potential-induced gradation increases. The asymmetry of the voltage differences, which can be characterized by the ratio of the second to the first voltage difference as per $(U_1-U_3)/(U_2-U_1)$, likewise initially increases as the degree of the potential-induced degradation increases, to then quickly strive toward a symmetrical distribution of the voltage differences as the potential-induced degradation progresses further. In this case, the symmetrical distribution of the voltage differences is denoted by a value of the ratio $(U_1-U_3)/(U_2-U_1)$ of one $((U_1-U_3)/(U_2-U_1)=1)$.

Gradient of the IU Characteristic

In a further embodiment of the method, the characteristic quantity Y is determined from a sixth parameter $W_6$ that takes into consideration a second gradient $m_{left}=(I_1-I_3)/(U_1-U_3)$, a first gradient $m_1=(I_2-I_1)/(U_2-U_1)$, or a ratio of the first and second gradients as per $m_1/m_{12}$ within the IU graph. As explained in conjunction with the description pertaining to FIG. 3f, the second gradient $m_2$ becomes more negative and has a larger absolute value as the degree of the potential-induced degradation increases. By contrast, the first gradient $m_1$ becomes more positive and has a smaller absolute value as the degree of the potential-induced degradation increases. Accordingly, the ratio of the first and second gradients as per $m_1/m_2$—or the absolute value thereof—become smaller as the degree of the potential-induced degradation increases.

The method according to the disclosure can involve the characteristic quantity Y being determined from a combination of at least two parameters, selected from a group comprising the first $W_1$, the second $W_2$, the third $W_3$, the fourth $W_4$, the fifth $W_5$ and the sixth parameter $W_6$. In this situation, the individual parameters used for determining the characteristic quantity Y can be weighted differently. This different weighting can be constant for all measurement passes, but it can also change during successive measurement passes. This makes sense, for example, if a particular parameter initially changes little as potential-induced degradation begins, but a change in this parameter takes place all the more strongly as the potential-induced degradation progresses further. By contrast, another parameter may already record a significant change as potential-induced degradation begins. Different weighting of the individual parameters—which weighting may possibly still be varied during successive measurement passes—allows the characteristic quantity Y that is to be determined to have as linear a profile as possible on the basis of a progressive potential-induced degradation—and hence on the basis of a parallel resistance $R_{Par}$ of the solar cell arrangement that characterizes the potential-induced degradation.

In one embodiment of the method, in addition to the determination of the characteristic quantity Y a plausibilization is effected as regards whether or to what extent a change in a value of the characteristic quantity Y relative to the values of the characteristic quantities Y from preceding measurements is also actually attributable to a change in a parallel resistance $R_{Par}$—and hence to a potential-induced degradation (PID) of the PV modules of the solar cell arrangement. Such a plausibilization may make sense because, in principle, an increase in series resistance $R_{Ser}$ also has an effect on a current/voltage or power/voltage characteristic of the solar cell arrangement similar to the decrease in the parallel resistance $R_{Par}$. Only the decrease in the parallel resistance $R_{Par}$ characterizes the progressive potential-induced degradation of the PV modules, however. As shown in conjunction with FIGS. 2a-2d, a change in the parallel resistance $R_{Par}$ can be distinguished from a change in the series resistance $R_{Ser}$ by virtue of at least one parameter from first generator voltage $U_1$, second generator voltage $U_2$, third generator voltage $U_3$ and no-load voltage $U_0$ of the solar cell arrangement being taken into consideration within the plausibilization. In particular, a profile of the at least one parameter can be evaluated in successive measurements in this case. In this situation, it is also possible for the at least one parameter to comprise a combination, for example a ratio, of one of the generator voltages $U_1, U_2, U_3$ and the no-load voltage $U_0$ of the solar cell arrangement.

In many cases, high values of the series resistance $R_{Ser}$ and a gradual or subtle increase in the series resistance $R_{Ser}$ can be precluded within the solar cell arrangement from the outset. In this case, such a plausibilization is not required. It is thus possible e.g. for an increase in the series resistance $R_{Ser}$ to result e.g. from a defect within a connecting cable between a PV inverter and the PV modules associated with the PV inverter or among the PV modules. Such a defect is for the most part locally confined, however, which is why severe heating occurs at the defect during operation of the PV installation on account of the high density of power loss at said defect. This heating then generally quickly results in another fault within the PV installation, e.g. an arc or even an interruption in the connecting cable and complete failure of parts of the PV installation. Such faults can be detected immediately and in another way, however. In contrast to the series resistance $R_{Ser}$, however, the parallel resistance $R_{Par}$ can decrease quite subtly without this necessarily producing another easily detectable fault within the PV installation. If a subtle change in the series resistance $R_{Ser}$ cannot be ruled out from the outset, however, it makes sense and is advantageous to perform the plausibilization.

In an advantageous variant, of the method according to the disclosure, a start of the measurement pass is effected under time control and/or under event control. In this way, successive measurement passes can occur at a particular interval of time from one another—for example daily, weekly or monthly—and possibly always at a particular time of day—for example 13:00 hours. Equally, the start of the measurement pass can also be triggered by a particular event. By way of example, a measurement pass can occur whenever it is certain that a predefined threshold value for an infeed power is exceeded. This provides a simple way of ensuring that a measurement pass occurs only whenever the PV generator of the PV installation experiences sufficient incident radiation. Equally, it is possible to ensure that the ambient conditions of the PV generator do not differ all too greatly from one another during successive measurement passes. Even if the ambient conditions have no significant influence on the determination of the characteristic quantity Y, it may make sense to minimize further a small influence still present by means of an event-controlled start of the measurement passes.

In a further variant of the method, a warning signal is generated if the characteristic quantity Y is outside a predefined tolerance range. The predefined tolerance range can characterize an inherently still correct state of the PV installation, the PV modules of which still have no significant degree of a potential-induced degradation. The warning signal can inform the operator of the PV installation about the correct state being left and about associated entry into a critical state of the PV installation. In this situation, the warning signal can be transmitted to the installation operator by wire or by radio using inherently known technologies (e.g. internet, email, SMS, etc.).

In an advantageous embodiment of the method, if the characteristic quantity Y is outside a predefined tolerance range, a generator potential (DC+, DC−) of the PV installation is shifted relative to a ground potential PE. A corresponding shift is advantageously effected under automatic control at a time at which the PV installation feeds no power into the connected system—for example at night. An appropriate potential shift allows a potential-induced degradation of the PV modules that has already set in and is detected early to be fixed again, at least to a certain degree. A life of the PV modules is therefore markedly increased in comparison with PV modules whose potential-induced degradation is not detected.

A photovoltaic (PV) inverter according to the disclosure that is suitable for detecting a potential-induced degradation (PID) of PV modules of a PV installation is disclosed. The PV interverter comprises a DC input for connecting a PV generator, and an AC output for connecting the PV inverter to a power supply system. The inverter further comprises a DC/AC converter unit that converts an input-side DC voltage into an output-side AC voltage. The PV inverter moreover has a control unit, connected to the DC/AC converter unit, for delivering a predefined flow of power via the DC input of the PV inverter. Moreover, the PV inverter comprises a current sensor for detecting a generator current $I_{Gen}$ at the DC input, a voltage sensor for detecting a generator voltage $U_{Gen}$ at the DC input, and an evaluation unit connected to the current sensor and the voltage sensor. In this case, the PV inverter is configured so as to perform a method according to the disclosure.

In this case, the input-side DC voltage means a DC voltage at the input of the DC/AC converter unit. This may, but does not have to, correspond to a DC voltage at the DC input of the PV inverter. This is not the case particularly if the PV inverter has a DC/DC converter unit connected upstream of the DC/AC converter unit that is capable of decoupling the DC input of the PV inverter from the input of the DC/AC converter unit.

When the method is performed, an inverter according to the disclosure is capable of detecting a potential-induced degradation of the PV modules connected to it. The detection thereof requires predominantly components (e.g. the control unit, current and voltage sensors) that are present anyway, in the case of conventional PV inverters and hence generate no additional costs. For the evaluation unit too, it is possible to use a programmable processor that is present in the PV inverter anyway. Said processor is merely programmed with a piece of software that renders the processor—and hence also the PV inverter—capable of performing the method according to the disclosure. The details provided as part of the description pertaining to the method according to the disclosure are also transferable mutatis mutandis to the PV inverter according to the disclosure, which is configured to perform the method according to the disclosure. Therefore, reference is made here to the implementations already described within the context of the method according to the disclosure.

In an advantageous embodiment, the PV inverter according to the disclosure is configured to generate a warning signal if the characteristic quantity Y is outside a predefined tolerance range. For this purpose, the PV inverter has a communication unit that is capable of sending the warning signal either by wire or by radio, for example using inherently known technologies (e.g. internet, email, SMS, etc.). In this way, an operator of the PV installation—and hence of the inverter—can be informed about a progressive potential-induced degradation of PV modules connected to the PV inverter and hence about an associated critical state of the applicable PV installation.

In a further embodiment, the PV inverter has a biasing unit that is configured to shift a generator potential (DC+, DC−) of a PV generator connected to the inverter relative to a ground potential PE. Such a biasing unit can be automatically activated and deactivated via the control unit of the PV inverter. To this end, the biasing unit can have a DC voltage source and a switching device. Advantageously, the biasing unit is connected to the control unit of the inverter. The switching device—and the DC voltage source—can therefore be activated and deactivated—in event-triggered and possibly also time-triggered fashion—via the control unit of the inverter. Hence, the PV inverter is configured to shift a generator potential or both generator potentials relative to the ground potential PE as soon as a particular degree of potential-induced degradation of the PV modules connected to the PV inverter is exceeded. In this way, it is possible for a potential-induced degradation of the PV modules that is detected early by the PV inverter and has already set in to be fixed again at least to a certain degree.

A photovoltaic (PV) installation according to the disclosure has a PV generator and an inverter according to the disclosure.

Advantageous developments of the disclosure are evident from the patent claims, the description and the drawings. The advantages of features and of combinations of a plurality of features as mentioned in the description are merely by way of example and can take effect alternatively or cumulatively, without the advantages necessarily having to be afforded by embodiments according to the disclosure. Without the subject matter of the accompanying patent claims being altered thereby, the following holds true with regard to the disclosure content of the original application documents and of the patent: further features can be gathered from the drawings—in particular the depicted relative arrangement and operative connection of a plurality of component parts. The combination of features of different embodiments of the disclosure or of features of different patent claims is likewise possible in a departure from the chosen dependency references of the patent claims and is suggested hereby. This also concerns such features as are depicted in separate drawings or are mentioned in the description thereof. These features can also be combined with features of different patent claims. It is likewise possible to omit features presented in the patent claims for further embodiments of the disclosure.

The features mentioned in the patent claims and the description should be understood, with regard to their number, such that exactly this number or a greater number than the number mentioned is present, without the need for explicit use of the adverb "at least". Therefore, if an element is mentioned, for example, this should be understood to mean that exactly one element, two elements or more elements are present. These features can be supplemented by other features or be the sole features of which the respective product consists.

The reference signs contained in the patent claims do not restrict the scope of the subjects protected by the patent claims. They merely serve the purpose of making the patent claims more easily understood.

BRIEF DESCRIPTION OF THE FIGURES

The disclosure is explained and described in further detail below on the basis of exemplary embodiments depicted in the figures.

FIG. 2b shows a family of curves for power/voltage characteristics within a PU graph given progressive potential-induced degradation computed taking into consideration a decrease in parallel resistance $R_{Par}$ of the equivalent circuit diagram from FIG. 1.

FIG. 3b shows the influence of a progressive potential-induced degradation on the parameter $W_2$, which takes into consideration a discrete-point fill factor FF within an IU graph.

FIG. 3c shows the influence of a progressive potential-induced degradation on the parameter $W_3$, which takes into consideration a difference between the first generator current ($I_1$) and a point on an imaginary straight connecting line within the IU graph.

FIG. 3d shows the influence of a progressive potential-induced degradation on the parameter $W_4$, which takes into consideration an asymmetry of current differences within the IU graph.

FIG. 3e shows the influence of a progressive potential-induced degradation on the parameter $W_5$, which takes into consideration an asymmetry of voltage differences within the IU graph.

FIG. 3f shows the influence of a progressive potential-induced degradation on the parameter $W_6$, which takes into consideration a gradient of the IU characteristic within the IU graph.

DETAILED DESCRIPTION

The disclosure relates to a method for detecting a potential-induced degradation (PID) of photovoltaic (PV) modules of a PV installation. The method is effected in the course of operation of the PV installation and is implementable inexpensively without additional sensor outlay. The method has a reduced infeed loss in comparison with known methods for detecting the potential-induced degradation. The disclosure relates moreover to a photovoltaic (PV) inverter for performing the method and to a photovoltaic (PV) installation having such a photovoltaic (PV) inverter.

Figure 1:
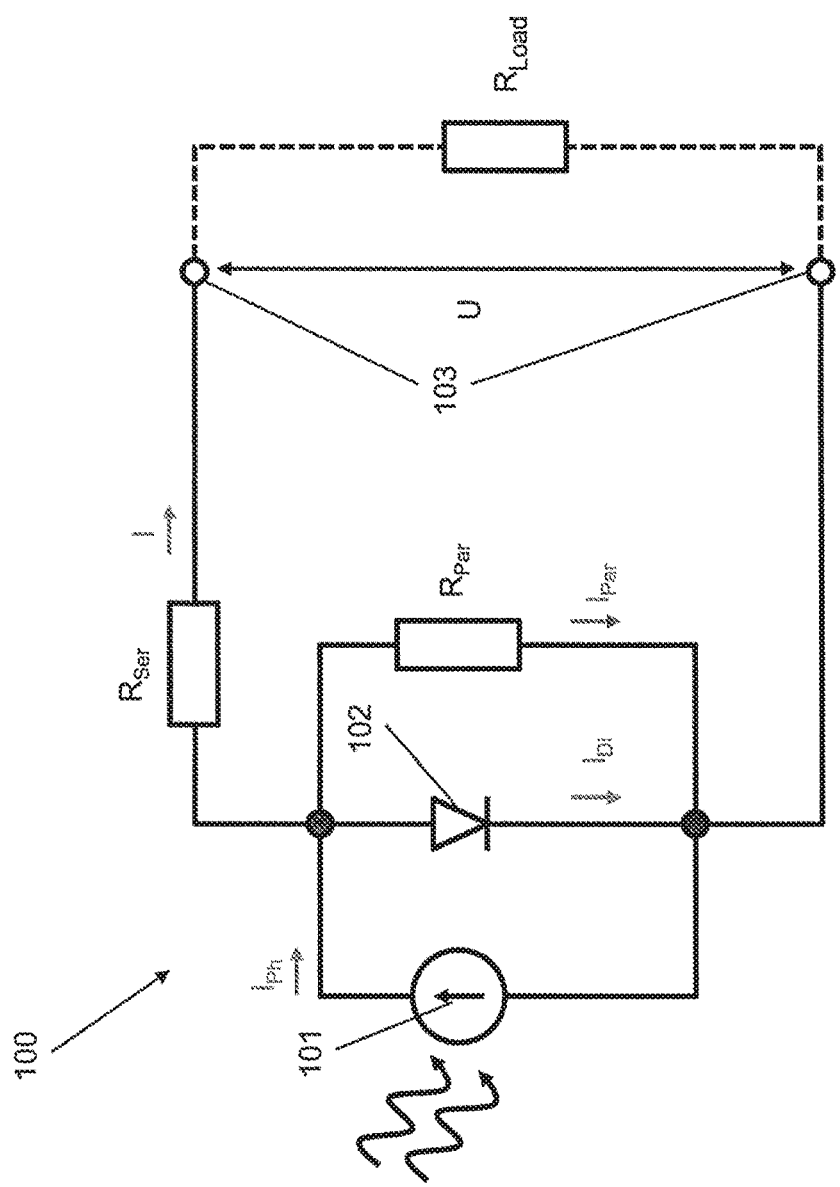
FIG. 1 shows an equivalent circuit diagram of a solar cell arrangement using which the effect of the potential-induced degradation of PV modules is described.

FIG. 1 shows an equivalent circuit diagram 100 of a solar cell arrangement, for example a PV module. The equivalent circuit diagram 100 has, in a known manner, a constant current source 101 that is connected up in parallel with a diode 102 and a parallel resistance $R_{Par}$. The parallel circuit comprising constant current source 101, diode 102 and parallel resistance $R_{Par}$ is connected to the output 103 of the solar cell arrangement via a series resistance $R_{Ser}$. The output 103 has a load resistance $R_{load}$ connected to it. The current $I_{Ph}$ produced by the constant current source 101 is dependent on the incident radiation on the solar cell arrangement, as symbolized by curly arrows in FIG. 1, and rises as the incident radiation increases. The current $I_{Ph}$ produced by the solar cell arrangement is split by the parallel circuit into a current $I_{Di}$ through the diode 102 connected in parallel with the constant current source 101, a current $I_{Par}$ through the resistance $R_{Par}$ connected in parallel with the constant current source 101, a useful current I that flows via the series resistance $R_{Ser}$ to the output 103 of the solar cell arrangement.

The output 103 of the solar cell arrangement has a load resistance $R_{load}$—for example a photovoltaic (PV) inverter—connected to it. The load resistance $R_{load}$ is therefore supplied with an electrical power P as per P=U*I by the solar cell arrangement. The power P drawn from the solar cell arrangement is therefore governed by the product of the voltage U present at the output 103 of the solar cell arrangement and the useful current I associated with this voltage. A high load resistance $R_{load}$ results in a state denoted by a negligibly small useful current I (I≈0) and a no-load voltage $U_0$ associated with this zero-useful-current state. By contrast, an extremely small load resistance $R_{load}$ results in a state in which almost all of the current $I_{Ph}$ produced by the constant current source 101 drains in the direction of the load resistance $R_{load}$. In this case, the voltage U at the output 103 of the solar cell arrangement collapses to negligibly small values (U≈0). Variation of the load resistance $R_{load}$ from relatively high to very low values delivers the known current/voltage characteristic of the solar cell arrangement within an IU graph.

A progressive potential-induced degradation of the solar cell arrangement can be described by means of a change in the parallel resistance $R_{Par}$ connected in parallel with the constant current source 101 and the diode 102 over time. Specifically, the parallel resistance $R_{Par}$ decreases as the degree of the potential-induced degradation increases, resulting in an increasing proportion of the current $I_{Ph}$ produced by the constant current source 101 draining via the parallel resistance $R_{Par}$. This proportion is therefore lost from the useful current I.

Figure 2A:
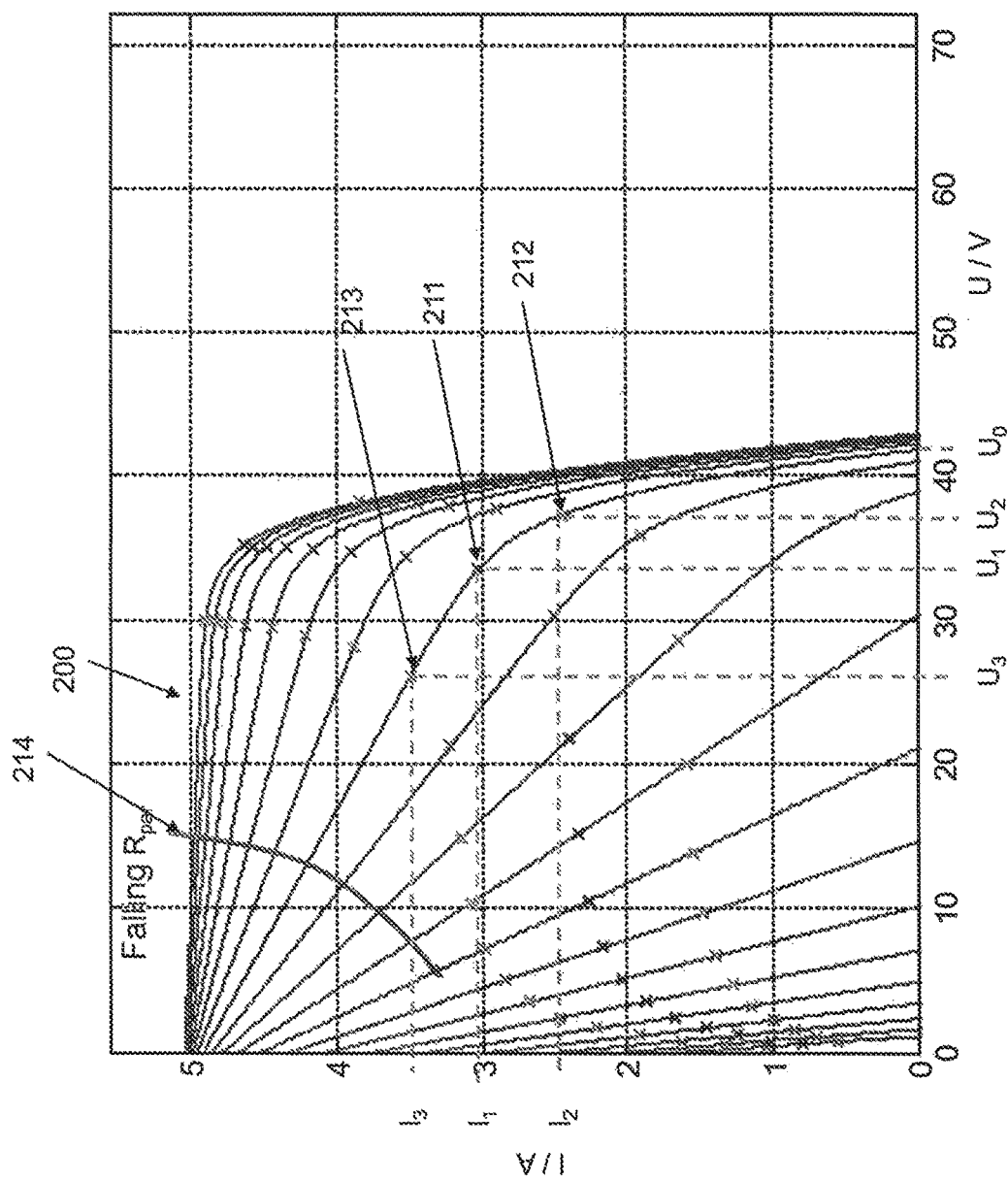
FIG. 2a shows a family of curves for current/voltage characteristics within an IU graph given progressive potential-induced degradation computed taking into consideration a decrease in parallel resistance $R_{Par}$ of the equivalent circuit diagram from FIG. 1.

FIG. 2a depicts a family of curves 200 for current/voltage characteristics of a solar cell arrangement in an IU graph. The individual characteristics of the family of curves 200 denote current/voltage characteristics of solar cell arrangements—for example of PV modules or strings of PV modules—with a different degree of the potential-induced degradation. Within the family of curves 200 for the current/voltage characteristics, the value of the parallel resistance $R_{Par}$ has been changed, given otherwise identical parameters, in order to depict the influence of a progressive potential-induced degradation on the current/voltage characteristic. Specifically, the value of the parallel resistance of the individual current/voltage characteristics within the family of curves decreases in the direction of the arrow 214. For each current/voltage characteristic, three respective operating points 211, 212, 213 are marked by applicable crosses on the characteristic curve. For the sake of clarity, the three operating points 211, 212, 213 are provided with reference signs only on one current/voltage characteristic by way of example. The first operating point 211 has an associated first generator voltage $U_1$, first generator current $I_1$ and first power as per $P_1=U_1*I_1$. In this situation, the first power $P_1$ is in a fixed first ratio $V_1$ with a power $P_{MPP}$ at the maximum power point of the solar cell arrangement. By way of example, the first ratio $V_1=1.00$ is chosen in this case. This is intended to be understood purely by way of example and in nonlimiting fashion, however. It is thus also possible for the power $P_1$ to be lower than the maximum possible power $P_{MPP}$ of the solar cell arrangement and to be in a first ratio $V_1<1.00$ therewith, for example $V_1=0.99$. A second operating point 212 is characterized by a second generator voltage $U_2$ and a second generator current $I_2$ and denotes an operating point at which the PV installation generates a second power $P_2$ as per $P_2=U_2*I_2$. In this situation, the second power $P_2$ is in a fixed second ratio $V_2=P_2/P_1$ relative to the first power $P_1$ of the first operating point 211 (in this case by way of example: $V_2=0.90$). A third operating point 213 is denoted by a third generator voltage $U_3$ and a third generator current $I_3$. At the third operating point 213, the solar cell arrangement generates a third electrical power $P_3$ as per $P_3=U_3*I_3$ that is likewise in a fixed third ratio $V_3=P_3/P_1$ with the first power $P_1$ of the first operating point 211 (in this case by way of example: $V_3=0.90$).

FIG. 2b illustrates a family of curves 220 for power/voltage characteristics of a solar cell arrangement in a PU graph that have been computed using the equivalent circuit diagram from FIG. 1 and with identical parameters as in FIG. 2a. In this case too, a first 211, a second 212 and a third 213 operating point are again marked for each of the power/voltage characteristics by crosses. Each of the three operating points 211, 212, 213 is denoted by respective applicable values of generator voltage $U_1$, $U_2$, $U_3$, generator current $I_1,I_2$ $I_3$ (not depicted in FIG. 2b) and power $P_1$, $P_2$, $P_3$, which are each identical to the values from FIG. 2a. In this respect, the operating points 211, 212, 213 of FIG. 2b are also identical, in principle, to the operating points 211, 212, 213 from FIG. 2a. For the sake of clarity, the operating points 211, 212, 213 are again provided with reference signs only on one of the power/voltage characteristics by way of example. Analogously to FIG. 2a, only the value of the parallel resistance $R_{Par}$ from FIG. 1 has also been varied in the family of curves 220 for the power/voltage characteristics in FIG. 2b given otherwise identical parameters, in order to illustrate the influence of the progressive potential-induced degradation on the power/voltage characteristic. In the family of curves 220, the parallel resistance $R_{Par}$ for the individual power/voltage characteristics decreases in the direction of the arrow 224.

Figure 2C:
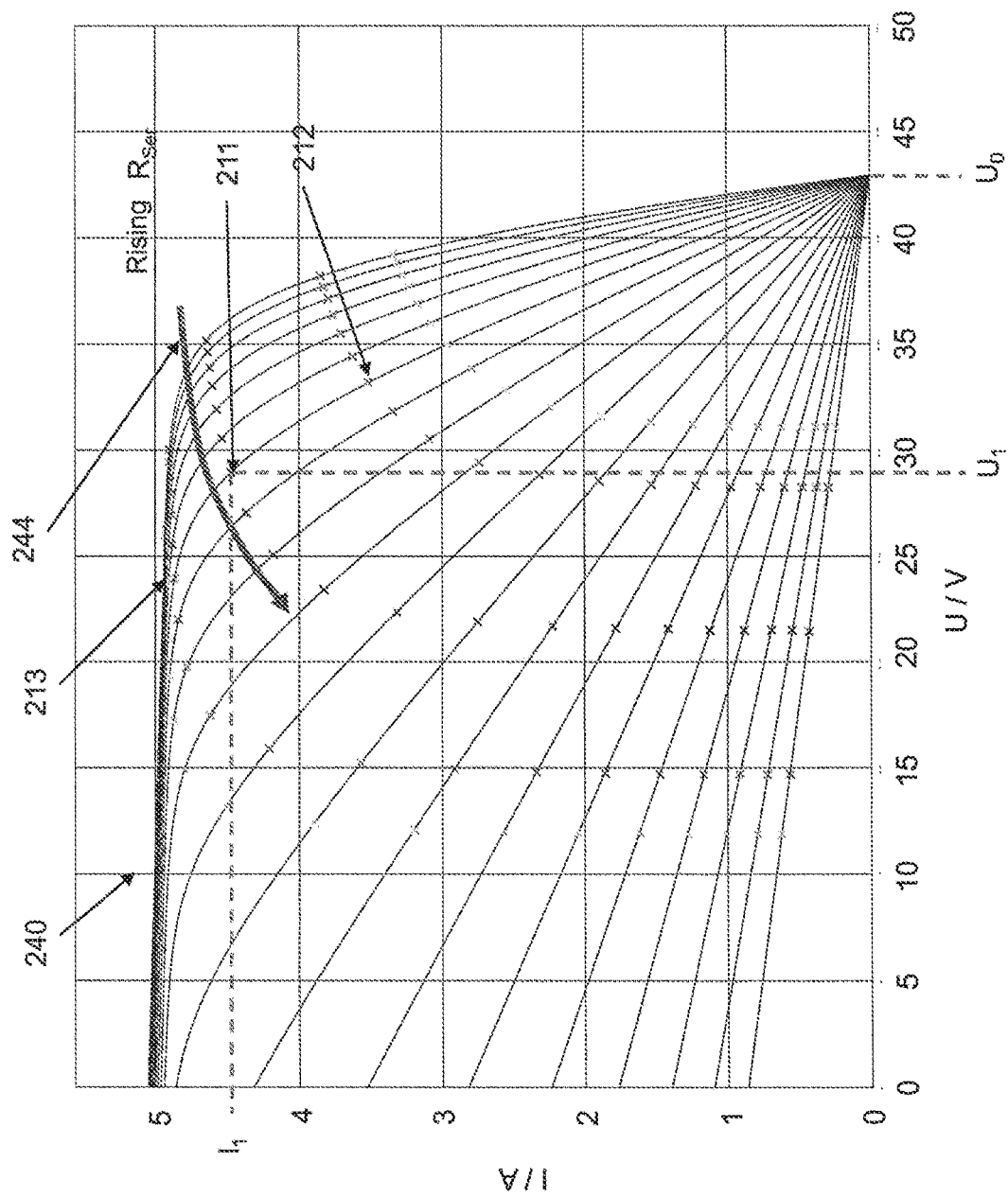
FIG. 2c shows a family of curves for current/voltage characteristics within an IU graph given increasing series resistance $R_{Ser}$, computed taking into consideration the equivalent circuit diagram from FIG. 1.
Figure 2D:
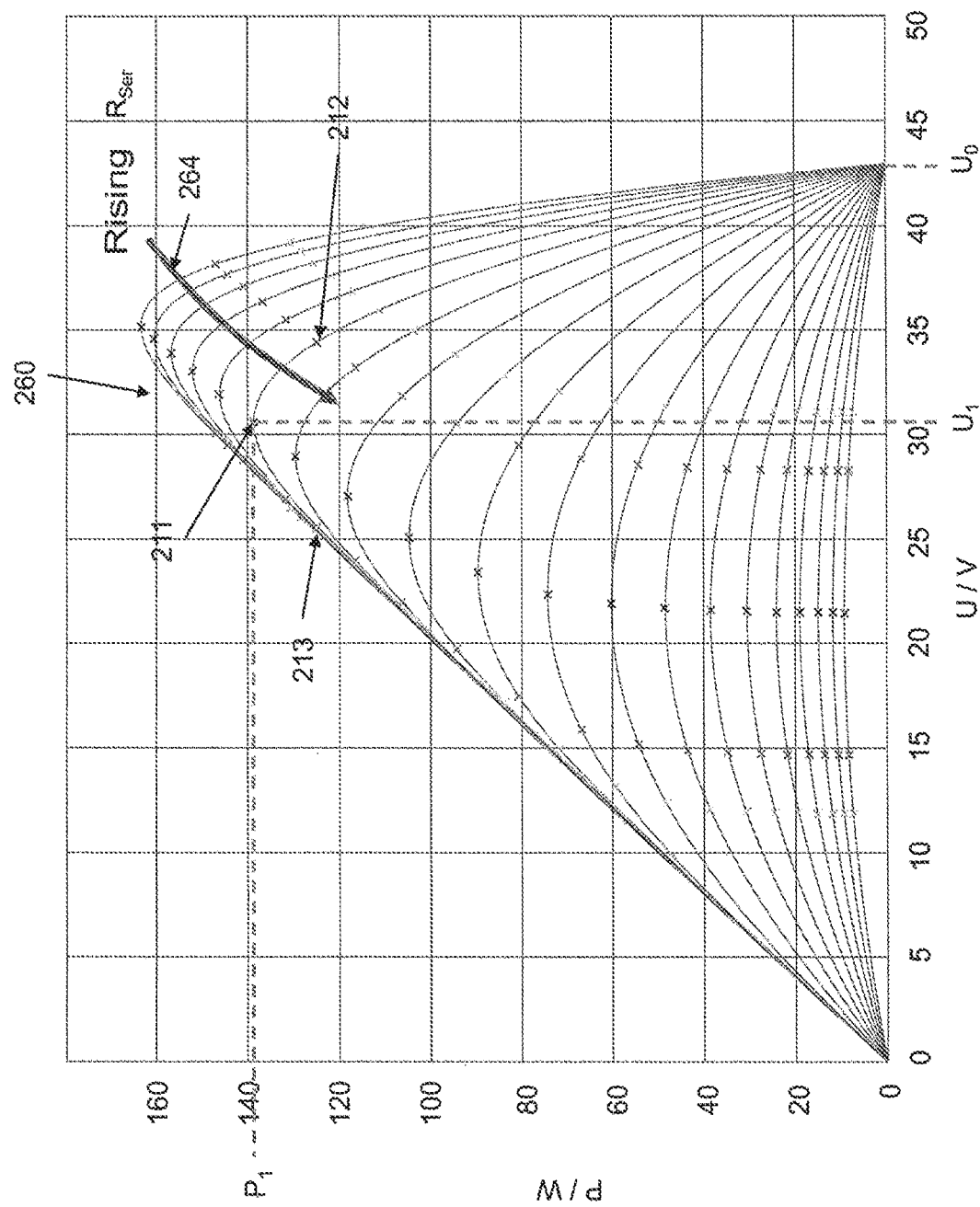
FIG. 2d shows a family of curves for power/voltage characteristics within a PU graph given increasing series resistance $R_{Ser}$, computed taking into consideration the equivalent circuit diagram from FIG. 1.

FIG. 2c illustrates a family of curves 240 for current/voltage characteristics of a solar cell arrangement in an IU graph that have been computed using the equivalent circuit diagram from FIG. 1. Whereas, for the computation of the family of curves in FIG. 2a, the parallel resistance $R_{Par}$ has been varied while the series resistance $R_{Ser}$ is kept constant, FIG. 2c now shows a family of curves for which the series resistance $R_{Ser}$ has been varied while the parallel resistance $R_{Par}$ has been kept constant. On each curve of the family of curves, the first operating point 211—in this case the MPP operating point—the second operating point 212 and a third operating point 213 are again marked by crosses. For the sake of clarity, the applicable values of the first generator current $I_1$ and of the first generator voltage $U_1$ are depicted merely at the first operating point 211. FIG. 2d shows a family of curves 260 for power/voltage characteristics in a PU graph, where the series resistance $R_{Ser}$ has been altered while the parallel resistance $R_{Par}$ has been kept constant in the same way as in FIG. 2c. Rising series resistances $R_{Ser}$ within the families of curves 240, 260 are symbolized by means of arrows 244, 264 in each of FIG. 2c and FIG. 2d.

From the graph in FIG. 2c, it becomes clear that, when the series resistance increases, the first generator voltage $U_1$—in this case the MPP voltage—initially decreases sharply, while no further change in the first generator voltage $U_1$ can be observed at an advanced time. Since the no-load voltage $U_0$ of the curves within the family of curves does not change, this response also applies, analogously, to the ratio of first generator voltage $U_1$ and no-load voltage $U_0$ as per $U_1/U_0$. This response differs in a fundamental manner from the family of curves from FIG. 2a, where the parallel resistance $R_{Par}$ has been varied while the series resistance $R_{Ser}$ has been kept constant. In that case, initially a merely negligible change in the first generator voltage $U_1$—in this case likewise the MPP voltage—can be observed as the parallel resistance $R_{Par}$ decreases. Only at an advanced time is it possible to observe a sharp decrease in the first generator voltage $U_1$. The no-load voltage $U_0$ in FIG. 2a also shows a similar response. It initially hardly changes, and decreases sharply within the family of curves only at an advanced time. This response is also reflected in a comparison of the power/voltage characteristics shown in FIGS. 2d and 2c. A corresponding response to that of the first generator voltage $U_1$ can also be recorded for the profile of the second generator voltage $U_2$ and of the third generator voltage $U_3$ within the families of curves in FIGS. 2a-2d.

By now evaluating at least one of the generator voltages $U_1$, $U_2$, $U_3$ and possibly also the no-load voltage $U_0$, in particular the trends thereof, in successive measurements, it is possible to clearly distinguish a change in the parallel resistance $R_{Par}$ from a change in the series resistance $R_{Ser}$. Thus, initially only the decrease in the parallel resistance $R_{Par}$ without a significant change in the first generator voltage $U_1$ occurs, but not the increase in the series resistance $R_{Ser}$. Since only the change in the parallel resistance $R_{Par}$, but not the change in the series resistance $R_{Ser}$, indicates a potential-induced degradation of the PV modules, it is possible to plausibilize whether or to what extent the change in the characteristic quantity Y is attributable to a potential-induced degradation of the PV modules of the solar cell arrangement.

In the description of the figures that follows—in particular within FIG. 3a to FIG. 3f—the index a on the reference signs denotes a respective state that still has no significant potential-induced degradation. By contrast, the index b denotes a state that has a potential-induced degradation that is already further advanced.

Figure 3A:
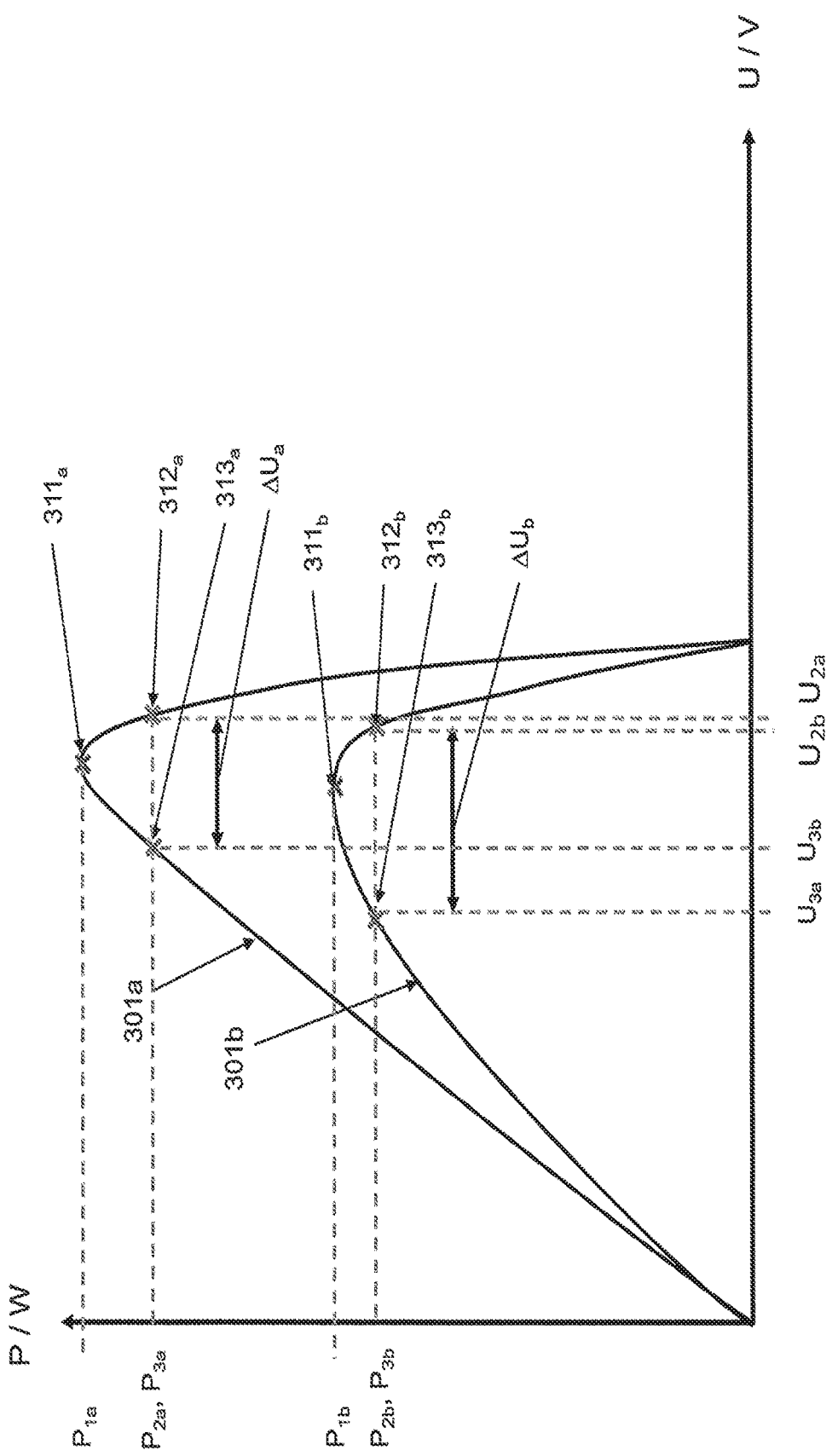
FIG. 3a shows the influence of a progressive potential-induced degradation on the parameter $W_1$, which takes into consideration a relative voltage width within a PU graph.

FIG. 3a illustrates the influence of a potential-induced degradation on a first parameter $W_1$, which takes into consideration a relative voltage width $\Delta U = U_2 - U_3$ within a PU graph. A power/voltage characteristic $301_a$ and a further power/voltage characteristic $301_b$ are depicted by way of example. The power/voltage characteristic $301_a$ therefore characterizes a solar cell arrangement, e.g. a PV module or a series connection of PV modules in the form of a string, in a state without significant potential-induced degradation. By contrast, the power/voltage characteristic $301_b$ denotes the same solar cell arrangement as that of the characteristic $301_a$, but now with a potential-induced degradation that is already further advanced. In accordance with FIG. 2b, the first $311_a$, $311_b$, the second $312_a$, $312_b$ and the third $313_a$, $313_b$ operating points are each symbolized by crosses on each of the power/voltage characteristics $301_a$, $301_b$ in this case too. Each of the first $311_a$, $311_b$, second $312_a$, $312_b$ and third $313_a$, $313_b$ operating points have associated applicable values of generator voltage $U_{1a,b}$, $U_{2a,b}$, $U_{3a,b}$, generator current $I_{1a,b}$, $I_{2a,b}$, $I_{3a,b}$ (not depicted in FIG. 3a) and power $P_{1a,b}$ as per $P_{1a,b} = U_{1a,b} * I_{1a,b}$, $P_{2a,b} = U_{2a,b} * I_{2a,b}$, $P_{3a,b} = U_{3a,b} * I_{3a,b}$. By way of example, the second power $P_{2a,b}$ is equal to the third power $P_{3a,b}$ each time in this case. The two are in a fixed ratio $V_2 = P_{2a,b}/P_{1a,b} = V_3 = P_{3a,b}/P_{1a,b} = 0.90$ with the first power $P_{1a,b}$. Specifically, the values of the second $V_2$ and third $V_3$ ratios may be different than 0.90 and in particular also different than one another. There is moreover a depiction of a relative voltage width $\Delta U_a = U_{2a} - U_{3a}$ around the first operating point $311_a$ of the power/voltage characteristic $301_a$ and of a relative voltage width $\Delta U_b = U_{2b} - U_{3b}$ around the first operating point $311_b$ of the further power/voltage characteristic $311_b$. The first parameter $W_{1a,b}$ takes into consideration this relative voltage width $\Delta U_{a,b}$. In this situation, the first parameter $W_{1a,b}$ may be equal to the relative voltage width $\Delta U_{a,b}$, but it can likewise also include still further terms besides the term of the relative voltage width $\Delta U_{a,b}$.

It becomes clear that the relative voltage width $\Delta U_{a,b}$ and hence also the first parameter $W_{1a,b}$ increases as the potential-induced degradation progress $\Delta U_b > \Delta U_a$. The effect of the increase is boosted if the first parameter $W_{1a,b}$ is equal to the dimensionless variable $\Delta U_{a,b}/U_{1a,b}$ or is computed as per $W_{1a,b} = \Delta U_{a,b}/P_{1,b}$. In one embodiment of the disclosure, the first parameter $W_{1a,b}$ is used for determining the characteristic quantity Y characterizing the progress of the potential-induced degradation. This means that the characteristic quantity Y is a function of at least the first parameter $W_{1a,b}$, but possibly also of still further parameters ($Y = Y(W_{1a,b}, \ldots)$).

FIG. 3b illustrates the influence of a potential-induced degradation on the second parameter $W_2$, which takes into consideration a discrete-point fill factor FF within an IU graph. Similarly to FIG. 3a, there are again two characteristics depicted, but now a current/voltage characteristic $302_a$ and a further current/voltage characteristic $302_b$. As in FIG. 3a, the current/voltage characteristic $302_a$ corresponds to a state without significant potential-induced degradation, while the further current/voltage characteristic $302_b$ denotes a state with a potential-induced degradation that is already further advanced. On each of the current/voltage characteristics $302_a$, $302_b$, the first $311_a$, $311_b$, the second $312_a$, $312_b$ and the third $313_a$, $313_b$ operating points are each again marked by crosses. Again, each of the first $311_a$, $311_b$, second $312_a$, $312_b$ and third $313_a$, $313_b$ operating points have associated applicable values of generator voltage $U_{1a,b}$, $U_{2a,b}$, $U_{3a,b}$, generator current $I_{1a,b}$, $I_{2a,b}$, $I_{3a,b}$ and power $P_{1a,b}$ as per $P_{1a,b} = U_{1a,b} * I_{1a,b}$, $P_{2a,b} = U_{2a,b} * I_{2a,b}$, $P_{3a,b} = U_{3a,b} * I_{3a,b}$ (not depicted in FIG. 3b).

The discrete-point fill factor FF is obtained from the operating points $311_{a,b}$, $312_{a,b}$ and $313_{a,b}$ characterizing the discrete points. The significance of the discrete-point fill factor corresponds to an area ratio of a first (smaller) rectangle $315_{a,b}$ relative to a second (larger) rectangle $316_{a,b}$ within the IU graph. In this situation, the area of the first rectangle $315_{a,b}$ is obtained as per $(U_{1a,b} - U_{3a,b}) * (I_{1a,b} - I_{2a,b})$. Analogously, the area of the second rectangle $316_{a,b}$ is obtained as per $(U_{2a,b} - U_{3a,b}) * (I_{3a,b} - I_{2a,b})$. This results in a discrete-point form factor FF as per $FF = (U_{1a,b} - U_{3a,b}) * (I_{1a,b} - I_{2a,b}) / ((U_{2a,b} - U_{3a,b}) * (I_{3a,b} - I_{2a,b}))$.

The discrete-point form factor FF defined in this way decreases as the potential-induced degradation progresses. The second parameter $W_{2a,b}$ takes into consideration this discrete-point fill factor FF. In this situation, the second parameter $W_{2a,b}$ may firstly be equal to the discrete-point fill factor defined above. However, the discrete-point fill factor FF may—besides the terms shown—also include still further terms. In one embodiment of the disclosure, the parameter $W_{2a,b}$ is used to determine the characteristic quantity Y characterizing the progress of the potential-induced degradation. This means that the characteristic quantity Y is a function of at least the second parameter $W_{2a,b}$, but possibly also of still further parameters ($Y = Y(W_{2a,b}, \ldots)$)

FIG. 3c depicts the influence of a progressive potential-induced degradation on the third parameter $W_3$ within the IU graph. In this situation, the IU graph and the current/voltage characteristics $302_a$, $302_b$ depicted therein are equal to that/those of FIG. 3b. Therefore, reference is made to the description of FIG. 3b for the general description of the graph structure and of the depicted current/voltage characteristics $302_a$, $302_b$.

The third parameter $W_3$ takes into consideration a difference between the first generator current $I_1$ and a point on an imaginary straight connecting line $320_{a,b}$ within the IU graph. The imaginary straight connecting line $320_{a,b}$ connects the second operating point $312_{a,b}$ having the coordinates ($U_{2a,b}$, $I_{2a,b}$) to the third operating point $313_{a,b}$ having the coordinates ($U_{3a,b}$, $I_{3a,b}$) within the IU graph. The difference between the first generator current $I_{1a,b}$ and the point on the imaginary straight connecting line $320_{a,b}$ is computed at the location of the voltage $U_{1a,b}$ each time and is symbolized by a distance arrow $321_{a,b}$ in FIG. 3c. The parameter $W_{3a,b}$ takes into consideration this difference and therefore more or less the length of the distance arrow $321_{a,b}$. As the potential-induced degradation progresses, the length of the distance arrow $321_{a,b}$ and therefore also the value of the third parameter $W_{3a,b}$ decreases.

In one embodiment of the disclosure, the third parameter $W_{3a,b}$ is used to determine the characteristic quantity Y. Therefore, the characteristic quantity Y is a function of at least the third parameter $W_{3a,b}$, but possibly also of still further parameters (Y=Y($W_{3a,b}$, . . . )).

FIG. 3d depicts the influence of a progressive potential-induced degradation on a fourth parameter $W_4$ within the IU graph. Again, the IU graph with the current/voltage characteristics $302_a$, $302_b$ depicted therein is equal to that/those of FIG. 3b, which is why reference is made to the description of FIG. 3b for the general description of the graph structure and of the depicted current/voltage characteristics $302_a$, $302_b$.

The fourth parameter $W_4$ takes into consideration an asymmetry of current differences within the IU graph. This is an asymmetry between a first $\Delta I_1$ and a second $\Delta I_2$ current difference. The first current difference is computed as per $\Delta I_1 = |I_{1a,b} - I_{2a,b}|$ and is symbolized by a distance arrow $331_{a,b}$ in FIG. 3d. The second current difference is computed as per $\Delta I_2 = |I_{3a,b} - I_{1a,b}|$ and is symbolized by a distance arrow $330_{a,b}$. A measure used for the asymmetry may be the ratio of the first to the second current difference as per $\Delta I_1/\Delta I_2 = |I_{1a,b} - I_{2a,b}|/|I_{3a,b} - I_{1a,b}|$. If the asymmetry is high, the ratio assumes high values, whereas it assumes the value $\Delta I_1/\Delta I_2 = 1.00$ in the symmetrical case. As potential induced degradation progresses, the asymmetry changes and hence so does the value of the fourth parameter $W_{4a,b}$ taking into consideration this asymmetry. For the case depicted in FIG. 3d that the second generator voltage $U_2$ is higher than the third generator voltage $U_3$, the ratio $\Delta I_1/\Delta I_2$ decreases as the potential-induced degradation progresses, whereas in the other case ($U_3 > U_2$), not depicted, the reciprocal of the ratio as per $\Delta I_2/\Delta I_1$ decreases as potential-induced degradation progresses. By means of a suitable choice of numerator and denominator, the fourth parameter $W_4$ can thus be defined such that a desired change—i.e. decrease or increase—in the fourth parameter $W_4$ as potential-induced degradation progresses can be set.

With knowledge of a basic profile of the current/voltage characteristic $302_a$, $302_b$, however, it may also be sufficient to determine the asymmetry of the current differences by ascertaining either just the second $\Delta I_2$ or just the first $\Delta I_1$ current difference. To exclusively determine the second current difference $\Delta I_2$, and to exclusively determine the first current difference $\Delta I_1$, just two operating points, e.g. only the first operating point 311 and the second operating point 312, are sufficient. Evaluating the ratio of the first $\Delta I_1$ and the second current difference as per $\Delta I_1/\Delta I_2$, on the other hand, requires at least three operating points, in particular the first 311, the second 312 and the third 313 operating point.

In one embodiment of the disclosure, the fourth parameter $W_{4a,b}$ is used to determine the characteristic quantity Y. Therefore, the characteristic quantity Y is a function of at least the fourth parameter $W_{4a,b}$, but possibly also of still further parameters (Y=Y($W_{4a,b}$, . . . )).

FIG. 3e depicts the influence of a progressive potential-induced degradation on a fifth parameter $W_5$ within the IU graph. For the general description of the graph structure and of the depicted current/voltage characteristics $302_a$, $302_b$, reference is again made to the description of FIG. 3b.

The fifth parameter $W_5$ takes into consideration an asymmetry of voltage differences. This is in particular the asymmetry of a first $\Delta U_1$ and a second $\Delta U_2$ voltage difference. The first voltage difference is computed as per $\Delta U_1 = |U_{2a,b} - U_{1a,b}|$ and is symbolized by a distance arrow $341_{a,b}$ in FIG. 3e. The second voltage difference is computed as per $\Delta U_2 = |U_{1a,b} - U_{3a,b}|$ and is symbolized by a distance arrow $340_{a,b}$ in FIG. 3e.

The measure used for the asymmetry may be the ratio of second to the first voltage difference as per $\Delta U_2/\Delta U_1 = |U_{1a,b} - U_{3a,b}|/|U_{2a,b} - U_{1a,b}|$. With knowledge of the basic response of the current/voltage characteristic $302_{a,b}$ during progressive potential-induced degradation, however, the knowledge of just either the first $\Delta U_1$ or the second $\Delta U_2$ voltage difference is sufficient to obtain a piece of information about the asymmetry of the voltage differences. To exclusively determine the second voltage difference $\Delta U_2$, and to exclusively determine the first voltage difference $\Delta U_1$, just two operating points, e.g. only the first operating point 311 and the second operating point 312, are sufficient. Evaluation of the ratio of the second $\Delta U_2$ and the first voltage difference as per $\Delta U_2/\Delta U_1$, on the other hand, requires at least three operating points, in particular the first 311, the second 312 and the third 313 operating point.

In one embodiment of the disclosure, the fifth parameter $W_{5a,b}$ is used to determine the characteristic quantity Y. Therefore, the characteristic quantity Y is a function of at least the fifth parameter $W_{5a,b}$, but possibly also of still further parameters (Y=Y($W_{5a,b}$, . . . )). In this case too, the fifth parameter $W_5$ can be defined by means of a suitable choice of the ratio $\Delta U_2/\Delta U_1$ or of the reciprocal for the ratio as per $\Delta U_1/\Delta U_2$ such that a progressive potential-induced degradation produces a desired change–i.e. decrease or increase—in the fifth parameter $W_5$.

FIG. 3f depicts the influence of the progressive potential-induced degradation on a sixth parameter $W_6$ within the IU graph. Owing to the identity of FIG. 3f to FIG. 3b in respect of the graph structure and the depicted current/voltage characteristics $302_a$, $302_b$, reference is again made in this regard to the corresponding description of FIG. 3b.

The sixth parameter $W_6$ takes into consideration a first gradient as per $m_1 = (I_{2a,b} - I_{1a,b})/(U_{2a,b} - U_{1a,b})$, a second gradient as per $m_2 = (I_{1a,b} - I_{3a,b})/(U_{1a,b} - U_{3a,b})$, or a ratio of the first and second gradients as per $m_1/m_2$ within the IU graph. In this situation, the first gradient $m_1$ corresponds to the gradient of a straight connecting line $351_{a,b}$ between the first $311_{a,b}$ and the second $312_{a,b}$ operating points, while the second gradient $m_2$ characterizes the gradient of a straight connecting line $350_{a,b}$ between the $313_{a,b}$ and the first $311_{a,b}$ operating point.

As potential-induced degradation progresses, the second gradient $m_2$ becomes more negative and has a larger absolute value, while the first gradient $m_1$ becomes more positive and has a smaller absolute value. Accordingly, the ratio of the first to the second gradient as per $m_1/m_2$ decreases as the degree of the potential-induced degradation rises, to finally strive toward the value $m_{right}/m_{left}=1.00$.

A sensitivity of the sixth parameter $W_6$ to the progressive potential-induced degradation can still be increased by virtue of the first operating point $311_{a,b}$ already having a reduced power $P_1$ in comparison with the power $P_{MPP}$ at the maximum power point of the PV installation and the first ratio being chosen as per $V_1=P_1/P_{MPP}<1.00$, for example $V_1=0.90$. In the case of the second gradient $m_2$, this results in a more positive and, in terms of absolute value, smaller gradient than for $V_1=1.00$. In the case of the first gradient $m_1$, it results in a more negative and, in terms of absolute value, larger gradient in comparison with $V_1=1.00$.

To exclusively determine the second gradient, and to exclusively determine the first gradient, just two operating points, e.g. the first operating point 311 and the second operating point 312, are sufficient. Evaluating the ratio of the first $m_1$ and the second $m_2$ gradient, on the other hand, requires at least three operating points, for example the first 311, the second 312 and the third 313 operating point. In order to increase the sensitivity of the sixth parameter $W_6$ further even taking into consideration the ratio of the first to the second gradient as per $m_1/m_2$, it is advantageous if additionally a fourth operating point 314 is also approached and the values of a fourth generator voltage $U_4$ and of a fourth generator current $I_4$ that are associated with the fourth operating point are ascertained. In this situation, the fourth operating point 314 is chosen such that a fourth power $P_4=U_4*I_4$ at the fourth operating point 314 is equal to the first power $P_1$ at the first operating point, but the fourth generator voltage $U_4$ is closer to the second generator voltage $U_2$ than is the case for the first generator voltage $U_1$. In this case, the first operating point 311 is thus closer within the IU graph to the third operating point 313, while the fourth operating point 314 is closer to the second operating point 313. Therefore, a second gradient as per $m_2=(I_{1a,b}-I_{3a,b})/(U_{1a,b}-U_{3a,b})$ and a first gradient as per $m_1=(I_{2a,b}-I_{4a,b})/(U_{2a,b}-U_{4a,b})$ can be ascertained. Accordingly, this results in a ratio of the first and second gradients as per $m_1/m_2$.

FIG. 3f depicts the case in which the second generator voltage $U_2$ is higher than the third generator voltage $U_3$. Here, the ratio of the first to the second gradient $m_1/m_2$ decreases as potential-induced degradation progresses. In the other case ($U_3>U_2$), not depicted, on the other hand, the reciprocal of the ratio as per $m_2/m_1$ decreases. Here too, a suitable choice of numerator and denominator allows the sixth parameter $W_6$ to be defined such that a desired change—i.e. decrease or increase—in the sixth parameter $W_6$ as potential-induced degradation progresses can be set.

In one embodiment of the disclosure, the sixth parameter $W_{6a,b}$ is used to determine the characteristic quantity Y. Therefore, the characteristic quantity Y is a function of at least the sixth parameter $W_{6a,b}$, but possibly also of still further parameters ($Y=Y(W_{6a,b}, \ldots)$).

Figure 4:
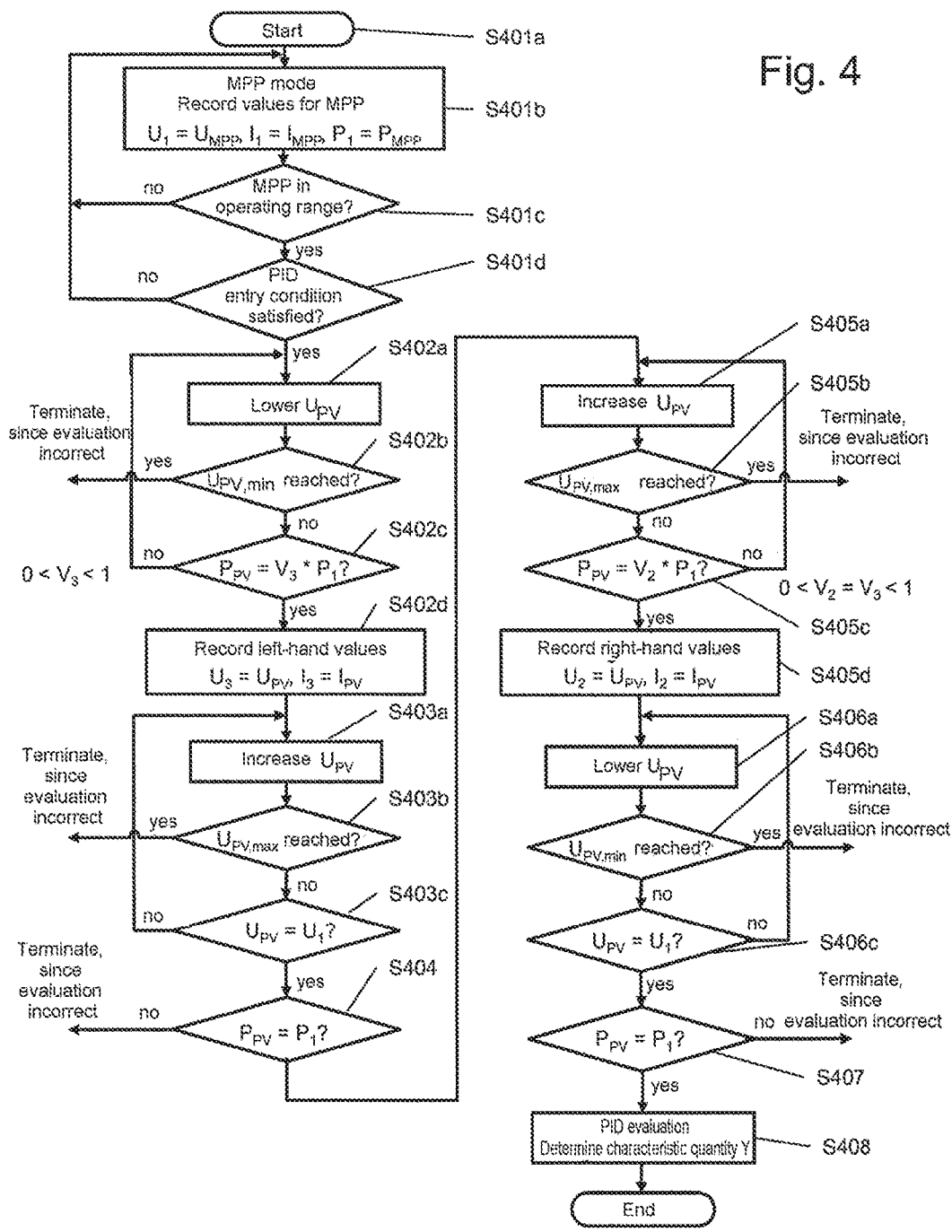
FIG. 4 shows a flowchart for an embodiment of the method according to the disclosure for detecting a potential-induced degradation of PV modules of a PV installation.

FIG. 4 illustrates a flowchart for an embodiment of the method according to the disclosure for detecting a potential-induced degradation of PV modules of a PV installation. The explanation that follows is provided by way of example using an embodiment of the method with a ratio of magnitudes for the first $U_1$, second $U_2$, and third $U_3$ generator voltages as per $U_3<U_1<U_2$. However, it is transferable mutatis mutandis to a ratio of magnitudes for the generator voltages as per $U_2<U_1<U_3$.

After a start at S401a, the method initially enters an MPP mode of the PV generator of the PV installation, which is denoted by S401b. In the MPP mode, the PV generator is operated at an MPP maximum power point $P_{MPP}$ by means of an MPP tracking. The MPP tracking results in each of the present values of the MPP generator voltage $U_{MPP}$, the MPP generator current $I_{MPP}$ and the MPP generator power $P_{MPP}=U_{MPP}*I_{MPP}$ being ascertained and being stored as first generator voltage $U_1$, first generator current $I_1$ and first power $P_1$. In this respect, the first operating point 311 corresponds to the MPP operating point. On the basis of the present values of the MPP operating point $I_1$, $U_1$, $P_1$, act S401c is used to check whether the present MPP operating point is within a predefined range that is standard for the normal MPP mode. By way of example, it is thus possible to check whether the PV generator is operated in a limited mode, which can occur as a result of the specification by a network operator, for example. In this case, a controller superordinate to the MPP tracking can prevent the PV generator or the PV installation from actually being operated at the MPP operating point. At the same time, it is thus checked whether the currently present MPP operating point is actually a global rather than just a local MPP operating point. If the MPP operating point is not in the range that is standard for the PV generator, then a measurement pass of the method for detecting a potential-induced degradation would result in incorrect values, and the method branches back to the MPP mode at S401b. If the MPP operating point is within the predefined operating range, the method transfers to S401d. Within act S401d, a check is performed to determine whether an entry condition for activating a measurement pass of the method for detecting the potential-induced degradation is satisfied. This entry condition can be provided under time control as a result of the expiration of a timer and/or event control—e.g. if the present MPP power $P_1$ is within a predefined range. If the entry condition is not satisfied, the method branches back to the MPP mode at S401b. If the entry condition is satisfied, on the other hand, the measurement pass starts and the method branches to S402a.

A left-hand third operating point 313 is now initially approached. To this end, the present generator voltage $U_{PV}$ is lowered at S402a. Act S402b is used to cross-check whether a minimum generator voltage $U_{PV,min}$ required for operation of the PV installation has been reached. If this is the case, then the measurement pass terminates, since the method would otherwise ascertain incorrect values. If the minimum generator voltage $U_{PV,min}$ required for operation of the PV installation has not yet been reached, however, act S402c is used to check whether a present power of the PV generator $P_{PV}$ is in a third ratio $V_3$ with the power $P_1$ of the PV generator. If this is not yet the case, the present generator voltage $U_{PV}$ needs to be lowered further and the method branches back to S402a. If the present power of the PV installation $P_{PV}$ is in the predefined third ratio $V_3$ with the power $P_1$ of the first operating point 311, on the other hand, then the third operating point 313 of the PV generator has been reached. At S402d that now follows, the values of a third generator voltage $U_3$ and of the third generator current $I_3$, possibly also of the third power $P_3=U_3*I_3$, that are associated with the third operating point 313 are stored.

Subsequently, a second operating point 312 is approached, but with the first operating point 311 being crossed a second time. For this purpose, the present generator voltage $U_{PV}$ is initially increased again at S403a. For the increase, act S403b is used to check the extent to which a maximum generator voltage $U_{PV,max}$ for operation of the PV generator has been reached. If this is the case, the method terminates. If the maximum generator voltage $U_{PV,max}$ has not yet been reached, however, act S403C is used to check whether present generator voltage $U_{PV}$ already corresponds to the first generator voltage $U_1$. If this is not yet the case, the method branches back to S403a and the present generator voltage $U_{PV}$ is increased further. If the present generator voltage $U_{PV}$ is equal to the first generator voltage $U_1$, the present power of the PV generator is ascertained and compared with the previously stored first power $P_1$ of the first operating point 311. Only if the present power $P_{PV}$ of the PV generator corresponds to the first power $P_1$ within predefined tolerance limits can it be assumed that the first operating point 311 has not changed during the measurement pass hitherto and the measurement pass can be continued. If the present power $P_{PV}$ of the PV generator is outside the predefined tolerance limits, however, the measurement pass of the method terminates.

When the measurement pass is continued, act S405a is now used to increase the present generator voltage $U_{PV}$ further. This further increase in the generator voltage $U_{PV}$ occurs at S405a, S405b and S405c, the structure of which is similar to that of acts S403a, S403b and S403c. At S405c, however, a check is now performed to determine the extent to which a present power of the PV installation $P_{PV}$ is in a second predefined ratio $V_2$ with the first power $P_1$ of the first operating point 311. If this is not yet the case, the method branches back to S405a and the present generator voltage $U_{PV}$ is increased further. If the present power of the PV installation $P_{PV}$ is in the second predefined ratio $V_2$ with the first power $P_1$ of the first operating point 311, on the other hand, then the second operating point 312 has been reached. The method branches to S405d, in which the right-hand values of the second generator voltage $U_2$ and of the second generator current $I_2$, possibly also of the second power $P_2$, are stored.

After the values associated with the second operating point 312 are stored, the present generator voltage $U_{PV}$ is lowered further. The present generator voltage $U_{PV}$ is lowered again to the value of the first generator voltage $U_1$ associated with the first operating point 311. This lowering occurs at S406a, S406b and S406c similarly to acts S402a, S402b and S402c already dealt with, which is why reference is made to the description given with said method acts for the details. Only the check on the branch back within act S406c is different than that of act S402c. Specifically, at S406c for branching back, a check is performed to determine whether present generator voltage $U_{PV}$ corresponds to the first generator voltage $U_1$ of the first operating point 311.

If the present generator voltage $U_{PV}$ does correspond to the first generator voltage $U_1$, the present power $P_{PV}$ of the PV installation is ascertained once again and compared with the previously stored first power $P_1$. Only when the present power $P_{PV}$ of the PV generator corresponds to the first power $P_1$ within predefined tolerance limits can it be assumed that the first operating point 311 has not changed during the entire measurement pass. In this case, an evaluation of the characteristic quantities Y is now effected at S408 on the basis of the stored values of the first $U_1$, second $U_2$ and third $U_3$, generator voltages, the first $I_1$, second $I_2$ and third $I_3$ generator currents, and possibly the first $P_1$, second $P_2$ and third $P_3$ powers. If the present power $P_{PV}$ of the PV generator does not correspond to the power $P_1$ at S407 taking into consideration predefined tolerance limits, however, the measurement pass terminates, since a change in the external conditions (for example: incident radiation and/or temperature) can be assumed and therefore a determination of the characteristic quantity Y would result in incorrect values.

When the characteristic quantity Y has been determined at S408, a measurement pass of the method according to the disclosure is at an end. A further measurement pass follows the already ended measurement pass under time and/or event control and the flowchart is executed again. Specifically, it is thus possible for successive measurement passes to be performed at a time interval of e.g. a day, a week or a month.

Figure 5:
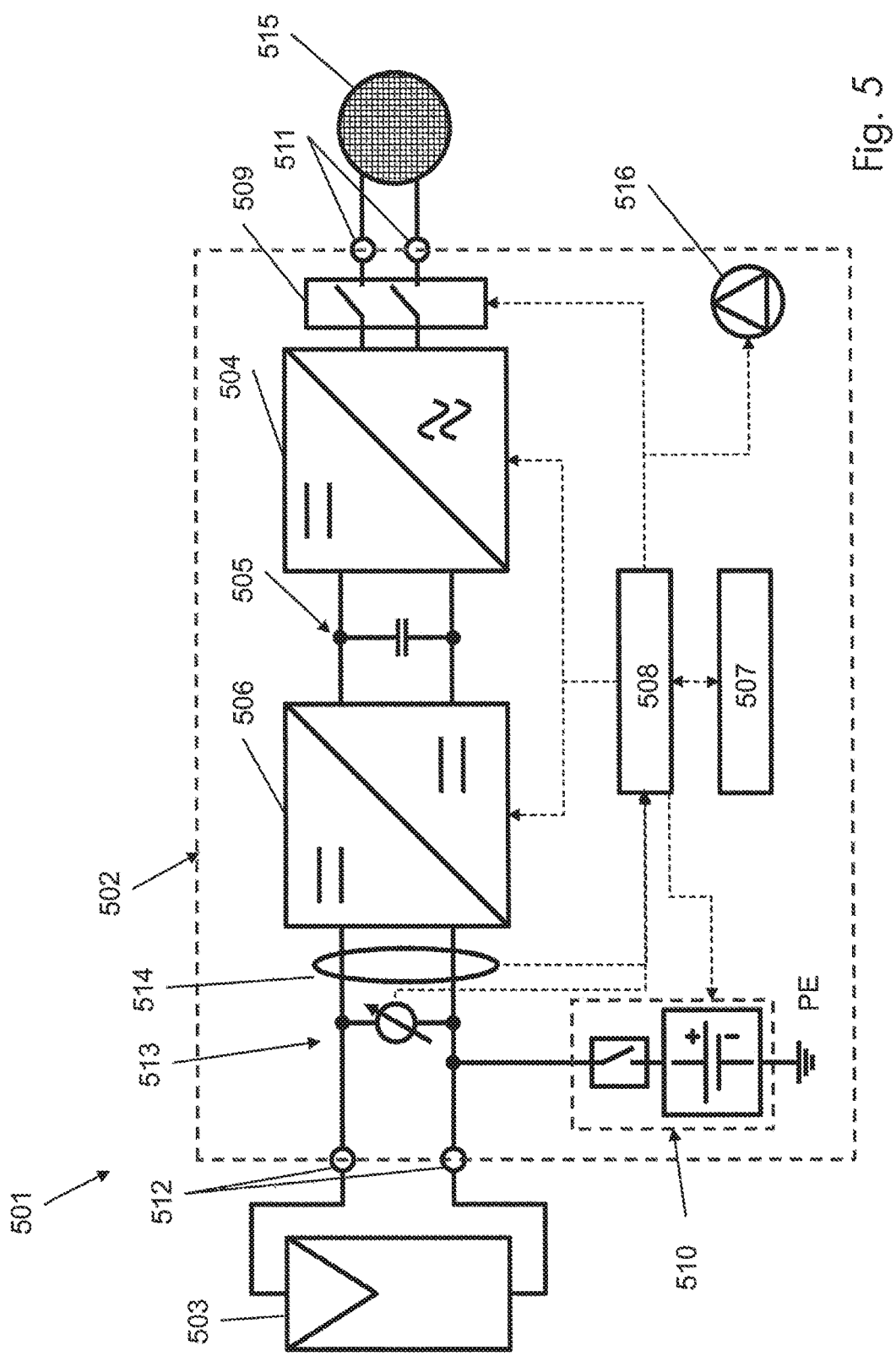
FIG. 5 shows a block diagram of a PV installation according to the disclosure with a PV inverter according to the disclosure that is configured to perform the method according to the disclosure for detecting a potential-induced degradation of PV modules.

FIG. 5 depicts a block diagram of a PV installation 501 according to the disclosure with a PV inverter 502 according to the disclosure. A DC input 512 of the PV inverter 502 has a PV generator 503 connected to it. An AC output 511 of the PV inverter 502 is connected to a power supply system 515. The PV inverter 502 has a DC/DC converter unit 506, a DC link circuit 505 and a DC/AC converter unit 504. The output side of the DC/AC converter unit 504 is connected to the AC output 511 of the PV inverter 502 via a system isolating relay 509. In this arrangement, the DC/AC converter unit is configured to convert an input-side DC voltage, for example the DC voltage of the DC link circuit 505, into an output-side AC voltage.

Further, the control unit 508 of the PV inverter 502 is connected to the DC/AC converter unit 504. The control unit 508 is suitable, if need be in conjunction with the DC/DC converter unit 506 and/or the DC/AC converter unit 504, for controlling the operation of the PV inverter 502 such that a predefined flow of power via the DC input 512 of the PV inverter 502 is observed. Moreover, the control unit 508 is suitable, if need be in conjunction with the DC/AC converter unit 504 and/or the upstream DC/DC converter unit 506, for setting a particular generator voltage $U_{PV}$ at the DC input 512 of the PV inverter 502.

Moreover, the PV inverter 502 has a current sensor 514 for detecting a generator current $I_{PV}$, and also a voltage sensor 513 for detecting a generator voltage $U_{PV}$. An evaluation unit 507 is connected to the current sensor 514 and the voltage sensor 513 and, at least for the purpose of a bidirectional data interchange—to the control unit 508. The PV inverter 502 is also configured to perform the method according to the disclosure for detecting a potential-induced degradation of PV modules.

The PV inverter 502 further has a biasing unit 510 connected to the control unit 508. The biasing unit 510 has an associated DC voltage source and switching unit. If the characteristic quantity Y ascertained during the method according to the disclosure is outside a predefined tolerance range and hence an already further advanced potential-induced degradation of PV modules of the PV generator is indicated, the control unit 508 activates the biasing unit 510 under time and/or event control. In this situation, the biasing unit 510 is used to shift a generator potential of a DC input 12—in this case: for example the negative DC input "DC−"—relative to a ground potential PE. In this way, a potential-induced degradation of the PV modules that has already set in can be fixed again at least to a certain degree, and the life of the PV generator and of the PV installation 501 can therefore be extended. Alternatively or cumulatively, the control unit 508 generates a warning signal 516 that is transmitted to the operator of the PV installation 501 via a communication unit, not depicted in FIG. 5. This informs the operator about a critical state arising in the PV installation 501.

In the embodiment depicted in FIG. 5, the DC/AC converter unit 504 has an upstream DC/DC converter unit 506. In this situation, the upstream DC/DC converter unit 506 is only optional and not absolutely necessary, however. It is also possible for the PV inverter 502 to have no DC/DC converter unit 506. In this case, the DC/AC converter unit 504 is configured, if need be in conjunction with the control unit 508, so as to set a prescribed generator voltage $U_{PV}$ at the DC input 512 of the PV inverter 502. Equally, it is possible for the PV inverter 502 to be a multistring inverter having multiple DC inputs 512 for connecting different PV generators 503 or PV generator elements. In this situation, the individual PV generator elements are each connected to the common DC link circuit 505 via a DC/DC converter 506. Every single PV generator element can use the control unit 508 to execute an independent MPP tracking. Equally, the PV inverter 502 is equipped, for each of the different DC inputs 512, with in each case a current sensor 514 for detecting a generator current $I_{PV}$ and a voltage sensor 513 for detecting a generator voltage $U_{PV}$ at the applicable DC input 512. It is therefore capable, in conjunction with the control unit 508 and the evaluation unit 507, of performing the method according to the disclosure for each of the PV generator elements connected to the PV inverter. In this situation, a measurement pass of the method can be effected for the individual PV generator elements independently of one another in succession or at the same time.

The invention claimed is:

1. A method for detecting a potential-induced degradation (PID) of PV modules of a PV installation, having a measurement pass, comprising:
    operating a PV generator of the PV installation at a maximum power point (MPP) with values of generator voltage ($U_{MPP}$) and generator current ($I_{MPP}$) associated with the maximum power point (MPP),
    operating the PV generator of the PV installation at a first generator voltage ($U_1$) and detection of a first generator current ($I_1$) associated with the first generator voltage ($U_1$),
    operating the PV generator of the PV installation additionally at a second generator voltage ($U_2$) and detection of a second generator current ($I_2$) associated with the second generator voltage ($U_2$),
    operating the PV generator at a third generator voltage ($U_3$), and detecting a third generator current ($I_3$) associated with the third generator voltage ($U_3$),
    wherein the first generator voltage ($U_1$) dictates that a first power ($P_1$), with $P_1 = U_1 * I_1$, of the PV generator at the first generator voltage ($U_1$) is in a predefined first ratio ($V_1$), with $V_1 = P_1/P_{MPP}$ and $V_1 \leq 1$, with the power ($P_{MPP}$) at the maximum power point (MPP) of the PV generator, and
    wherein the second generator voltage ($U_2$) dictates that a second power ($P_2$), with $P_2 = U_2 * I_2$, of the PV generator at the second generator voltage ($U_2$) is in a predefined second ratio ($V_2$), with $V_2 = P_2/P_1$ and $V_2 < 1$, with the first power ($P_1$) of the PV generator, and
    wherein the third generator voltage ($U_3$) dictates that a third power ($P_3$), with $P_3 = U_3 * I_3$, of the PV generator at the third generator voltage ($U_3$) is in a predefined third ratio ($V_3$), with $V_3 = P_3/P_1$ and $V_3 < 1$, with the first power ($P_1$) of the PV generator, and a relationship in the form ($U_3 < U_1 < U_2$) or a relationship in the form ($U_2 < U_1 < U_3$) applies to the generator voltages ($U_1$, $U_2$, $U_3$) in accordance with their values,
    wherein a characteristic quantity Y that characterizes a progress of the potential-induced degradation is determined from the values of the first, the second and the third generator voltage ($U_1$, $U_2$, $U_3$) and/or the first, the second and the third generator current ($I_1$, $I_2$, $I_3$),
    wherein during a measurement pass a first approach and, with staggered timing from the first approach, a further approach are effected for one of the generator voltages ($U_1$, $U_2$, $U_3$),
    wherein the further approach to the respective generator voltage ($U_1$, $U_2$, $U_3$) also results in a further generator current ($I_{1,2}$, $I_{2,2}$, $I_{3,2}$) being detected, and
    wherein values of the further generator current ($I_{1,2}$, $I_{2,2}$, $I_{3,2}$) are compared with applicable values of the generator current ($I_1$, $I_2$, $I_3$) of the first approach to the respective generator voltage ($U_1$, $U_2$, $U_3$), and
    wherein an applicable measurement pass is used to determine the characteristic quantity Y only when an absolute value of a difference between the generator current ($I_1$, $I_2$, $I_3$) and the further generator current ($I_{1,2}$, $I_{2,2}$, $I_{3,2}$) is below a predefined threshold value $\Delta I$.

2. The method as claimed in claim 1, wherein the third power ($P_3$) of the PV generator at the third generator voltage ($U_3$) is equal to the second power ($P_2$) of the PV generator at the second generator voltage ($U_2$).

3. The method as claimed in claim 1, wherein the first approach to one of the generator voltages ($U_1$, $U_2$, $U_3$) is effected at a beginning of the measurement pass, and the further approach to the respective generator voltage ($U_1$, $U_2$, $U_3$) is effected at an end of the measurement pass.

4. The method of claim 1, wherein the first generator voltage ($U_1$) denotes a maximum power point of the PV generator (MPP).

5. The method of claim 1, wherein the characteristic quantity Y is determined from a first parameter ($W_1$) that takes into consideration a relative voltage width $\Delta U = U_2 - U_3$ around an operating point at the power $P_1$ within a PU graph.

6. The method of claim 1, wherein the characteristic quantity Y is determined from a second parameter ($W_2$) that takes into consideration a discrete-point fill factor (FF) within an IU graph.

7. The method as claimed in claim 1, wherein the characteristic quantity Y is determined from a third parameter ($W_3$) that takes into consideration a difference between the first generator current ($I_1$) and a point on an imaginary straight connecting line between the points ($U_2$, $I_2$) and ($U_3$, $I_3$) within an IU graph at the location of the first generator voltage ($U_1$).

8. The method as claimed in claim 1, wherein the characteristic quantity Y is determined from a fourth parameter ($W_4$) that takes into consideration a first current difference ($I_1 - I_2$), a second current difference ($I_3 - I_1$) or a ratio of the first and second current differences between the generator currents ($I_1$, $I_2$, $I_3$) as per ($I_1 - I_2$)/($I_3 - I_1$) at the respective generator voltages ($U_1$, $U_2$, $U_3$) within an IU graph.

9. The method as claimed in claim 1, wherein the characteristic quantity Y is determined from a fifth parameter ($W_5$) that takes into consideration a first voltage difference ($U_2 - U_1$), a second voltage difference ($U_1 - U_3$) or a ratio of the first and second voltage differences between the generator voltages ($U_1$, $U_2$, $U_3$) as per ($U_1 - U_3$)/($U_2 - U_1$) within an IU graph.

10. The method as claimed in claim 1, wherein the characteristic quantity Y is determined from a combination of at least two parameters, selected from a group comprising a first ($W_1$), a second ($W_2$), a third ($W_3$), a fourth ($W_4$), a fifth ($W_5$) and a sixth ($W_6$) parameter;
    wherein the first parameter ($W_1$) takes into consideration a relative voltage width $\Delta U = U_2 - U_3$ round the operating point at the power $P_1$ within a PU graph; and wherein the second parameter ($W_2$) takes into consideration a discrete-point fill factor (FF) within an IU graph; and wherein the third parameter ($W_3$) takes into consideration a difference between the first generator current ($I_1$) and a point on an imaginary straight connecting line between the points ($U_2$, $I_2$) and ($U_3$, $I_3$) within the IU graph at the location of the first generator voltage ($U_1$); and wherein the fourth parameter ($W_4$) takes into consideration a first current difference ($I_1-I_2$), a second current difference ($I_3-I_1$) or a ratio of the first and second current differences between the generator currents ($I_1$, $I_2$, $I_3$) as per ($I_1-I_2$)/($I_3-I_1$) at the respective generator voltages ($U_1$, $U_2$, $U_3$) within the IU graph; and wherein the fifth parameter ($W_5$) takes into consideration a first voltage difference ($U_2-U_1$), a second voltage difference ($U_1-U_3$) or a ratio of the first and second voltage differences between the generator voltages ($U_1$, $U_2$, $U_3$) as per ($U_1-U_3$)/($U_2-U_1$) within the IU graph; and wherein the sixth parameter ($W_6$) takes into consideration a second gradient $m_2=(I_1-I_3)/(U_1-U_3)$, a first gradient $m_1=(I_2-I_1)/(U_2-U_1)$ a ratio of the first and second gradients $m_1/m_2$ within the IU graph.

11. The method as claimed in claim 10, wherein the determination of the characteristic quantity Y involves the at least two parameters being weighted differently.

12. The method as claimed in claim 1, wherein in addition to the determination of the characteristic quantity Y a check is performed to determine whether a change in a value of the characteristic quantity Y relative to values of the characteristic quantity Y from preceding measurements is attributable to a change in a parallel resistance $R_{par}$ that characterizes the potential-induced degradation (PID) of the PV modules, wherein the check is performed taking into consideration at least one parameter from the first generator voltage ($U_1$), the second generator voltage ($U_2$), the third generator voltage ($U_3$) and a no-load voltage $U_0$ of the PV generator.

13. The method as claimed in claim 1, wherein a start of the measurement pass is effected under time control and/or under event control.

14. The method as claimed in claim 1, further comprising generating a warning signal when the characteristic quantity Y is outside a predefined tolerance range.

15. A method for detecting a potential-induced degradation (PID) of PV modules of a PV installation, having a measurement pass, comprising:
operating a PV generator of the PV installation at a maximum power point (MPP) with values of generator voltage ($U_{MPP}$) and generator current ($I_{MPP}$) associated with the maximum power point (MPP),
operating the PV generator of the PV installation at a first generator voltage ($U_1$) and detection of a first generator current ($I_1$) associated with the first generator voltage ($U_1$),
operating the PV generator of the PV installation additionally at a second generator voltage ($U_2$) and detection of a second generator current ($I_2$) associated with the second generator voltage ($U_2$),
operating the PV generator of the PV installation additionally at a third generator voltage ($U_3$), and detecting a third generator current ($I_3$) associated with the third generator voltage ($U_3$),
wherein the first generator voltage ($U_1$) dictates that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \le 1$, with the power ($PMPP$) at the maximum power point (MPP) of the PV generator, and wherein the second generator voltage ($U_2$) dictates that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator, wherein the third generator voltage ($U_3$) dictates that a third power ($P_3$), with $P_3=U_3*I_3$, of the PV generator at the third generator voltage ($U_3$) is in a predefined third ratio ($V_3$), with $V_3=P_3/P_1$ and $V_3<1$, with the first power ($P_1$) of the PV generator, and a relationship in the form ($U_3<U_1<U_2$) or a relationship in the form ($U_2<U_1<U_3$) applies to the generator voltages ($U_1$, $U_2$, $U_3$) in accordance with their values, and wherein a characteristic quantity Y that characterizes a progress of the potential-induced degradation (PID) is determined from a sixth parameter ($W_6$) that takes into consideration a second gradient $m_2=(I_1-I_3)/(U_1-U_3)$, a first gradient $m_1=(I_2-I_1)/(U_2-U_1)$, a ratio of the first and second gradients $m_1/m_2$ within an IU graph.

16. A method for detecting a potential-induced degradation (PID) of PV modules of a PV installation, having a measurement pass, comprising:
operating a PV generator of the PV installation at a maximum power point (MPP) with values of generator voltage ($U_{MPP}$) and generator current ($I_{MPP}$) associated with the maximum power point (MPP),
operating the PV generator of the PV installation at a first generator voltage ($U_1$) and detection of a first generator current ($I_1$) associated with the first generator voltage ($U_1$),
operating the PV generator of the PV installation additionally at a second generator voltage ($U_2$) and detection of a second generator current ($I_2$) associated with the second generator voltage ($U_2$),
wherein the first generator voltage ($U_1$) dictates that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \le 1$, with the power ($P_{MPP}$) at the maximum power point (MPP) of the PV generator, wherein the second generator voltage ($U_2$) dictates that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator, wherein a characteristic quantity Y that characterizes a progress of the potential-induced degradation (PID) is determined from the values of the first and second generator voltages ($U_1$, $U_2$) and/or the first and second generator currents ($I_1$, $I_2$), and shifting a generator potential (DC+, DC−) of the PV installation relative to a ground potential (PE) when the characteristic quantity Y is outside a predefined tolerance range.

17. A photovoltaic (PV) inverter, suitable for detecting a potential-induced degradation (PID) of PV modules of a PV installation, comprising:
a DC input terminal configured to connect to a PV generator,
an AC output terminal configured to connect the PV inverter to a power supply system,
a DC/AC converter circuit configured to convert an input-side DC voltage into an AC voltage, a control circuit, connected to the DC/AC converter circuit, configured to deliver a predefined flow of power via the DC input terminal of the PV inverter, a current sensor configured to detect a generator current ($I_{PV}$) at the DC input, a voltage sensor configured to detect a generator voltage ($U_{PV}$) at the DC input, an evaluation circuit connected to the current sensor and the voltage sensor, wherein the PV inverter is configured to:
  operate a PV generator of the PV installation at a maximum power point (MPP) with values of generator voltage ($U_{MPP}$) and generator current ($I_{MPP}$) associated with the maximum power point (MPP),
  operate the PV generator of the PV installation at a first generator voltage ($U_1$) and detection of a first generator current ($I_1$) associated with the first generator voltage ($U_1$),
  operate the PV generator of the PV installation additionally at a second generator voltage ($U_2$) and detection of a second generator current ($I_2$) associated with the second generator voltage ($U_2$),
    wherein the first generator voltage ($U_1$) dictates that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \leq 1$, with the power (PMPP) at the maximum power point (MPP) of the PV generator,
    wherein the second generator voltage ($U_2$) dictates that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator,
    wherein a characteristic quantity Y that characterizes a progress of the potential-induced degradation (PID) is determined from the values of the first and second generator voltages ($U_1$, $U_2$) and/or the first and second generator currents ($I_1$, $I_2$), and
  wherein the PV inverter has a biasing unit configured to shift a generator potential (DC+, DC−) relative to a ground potential (PE) when the characteristic quantity Y is outside a predefined tolerance range.

18. The PV inverter as claimed in claim 17, wherein the PV inverter is configured to generate a warning signal when the characteristic quantity Y is outside a predefined tolerance range.

19. A photovoltaic (PV) installation, comprising:
a PV generator,
a biasing unit configured to shift a generator potential (DC+, DC−) relative to a ground potential (PE), and
a PV inverter, comprising
a DC input terminal configured to connect to the PV generator,
an AC output terminal configured to connect the PV inverter to a power supply system,
a DC/AC converter circuit configured to convert an input-side DC voltage into an AC voltage,
a control circuit, connected to the DC/AC converter circuit, configured to deliver a predefined flow of power via the DC input of the PV inverter,
a current sensor configured to detect a generator current ($I_{PV}$) at the DC input,
a voltage sensor configured to detect a generator voltage ($U_{PV}$) at the DC input,
an evaluation circuit connected to the current sensor and the voltage sensor,
wherein the PV inverter is configured to:
  operate the PV generator of the PV installation at a maximum power point (MPP) with values of generator voltage ($U_{MPP}$) and generator current ($I_{MPP}$) associated with the maximum power point (MPP),
  operate the PV generator of the PV installation at a first generator voltage ($U_1$) and detection of a first generator current ($I_1$) associated with the first generator voltage ($U_1$),
  operate the PV generator of the PV installation additionally at a second generator voltage ($U_2$) and detection of a second generator current ($I_2$) associated with the second generator voltage ($U_2$),
    wherein the first generator voltage ($U_1$) dictates that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \leq 1$, with the power ($P_{MPP}$) at the maximum power point (MPP) of the PV generator,
    wherein the second generator voltage ($U_2$) dictates that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator,
    wherein a characteristic quantity Y that characterizes a progress of potential-induced degradation (PID) is determined from the values of the first and second generator voltages ($U_1$, $U_2$) and/or the first and second generator currents ($I_1$, $I_2$), and
  wherein the generator potential (DC+, DC−) is shifted relative to the ground potential (PE) when the characteristic quantity Y is outside a predefined tolerance range.

20. A photovoltaic (PV) inverter, suitable for detecting a potential-induced degradation (PID) of PV modules of a PV installation, comprising:
a DC input terminal configured to connect to a PV generator,
an AC output terminal configured to connect the PV inverter to a power supply system,
a DC/AC converter circuit configured to convert an input-side DC voltage into an AC voltage,
a control circuit, connected to the DC/AC converter circuit, configured to deliver a predefined flow of power via the DC input of the PV inverter,
a current sensor configured to detect a generator current ($I_{PV}$) at the DC input,
a voltage sensor configured to detect a generator voltage ($U_{PV}$) at the DC input,
an evaluation circuit connected to the current sensor and the voltage sensor,
wherein the PV inverter is configured to:
  operate a PV generator of the PV installation at a maximum power point (MPP) with values of generator voltage ($U_{MPP}$) and generator current ($I_{MPP}$) associated with the maximum power point (MPP), beginning a measurement pass,
  operate the PV generator of the PV installation at a first generator voltage ($U_1$) and detection of a first generator current ($I_1$) associated with the first generator voltage ($U_1$),
  operate the PV generator of the PV installation additionally at a second generator voltage ($U_2$) and detection of a second generator current ($I_2$) associated with the second generator voltage ($U_2$),
  operating the PV generator at a third generator voltage ($U_3$), and detecting a third generator current ($I_3$) associated with the third generator voltage ($U_3$),
    wherein the first generator voltage ($U_1$) dictates that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \leq 1$, with the power ($P_{MPP}$) at the maximum power point (MPP) of the PV generator, and wherein the second generator voltage ($U_2$) dictates that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator, wherein the third generator voltage ($U_3$) dictates that a third power ($P_3$), with $P_3=U_3*I_3$, of the PV generator at the third generator voltage ($U_3$) is in a predefined third ratio ($V_3$), with $V_3=P_3/P_1$ and $V_3<1$, with the first power ($P_1$) of the PV generator, and a relationship in the form ($U_3<U_1<U_2$) or a relationship in the form ($U_2<U_1<U_3$) applies to the generator voltages ($U_1$, $U_2$, $U_3$) in accordance with their values, wherein a characteristic quantity Y that characterizes a progress of the potential-induced degradation is determined from the values of the first, the second and the third generator voltage (U1, U2, U3) and/or the first, the second and the third generator current ($I_1$, $I_2$, $I_3$), wherein during the measurement pass a first approach and, with staggered timing from the first approach, a further approach are effected for one of the generator voltages ($U_1$, $U_2$, $U_3$), wherein the further approach to the respective generator voltage ($U_1$, $U_2$, $U_3$) also results in a further generator current ($I_{1,2}$, $I_{2,2}$, $I_{3,2}$) being detected, and wherein values of the further generator current ($I_{1,2}$, $I_{2,2}$, $I_{3,2}$) are compared with the applicable values of the generator current ($I_1$, $I_2$, $I_3$) of the first approach to the respective generator voltage ($U_1$, $U_2$, $U_3$), and wherein the applicable measurement pass is used to determine the characteristic quantity Y only when an absolute value of a difference between the generator current ($I_1$, $I_2$, $I_3$) and the further generator current ($I_{1,2}$, $I_{2,2}$, $I_{3,2}$) is below a predefined threshold value $\Delta I$.

21. A photovoltaic (PV) inverter, suitable for detecting a potential-induced degradation (PID) of PV modules of a PV installation, comprising:

a DC input terminal configured to connect to a PV generator, an AC output terminal configured to connect the PV inverter to a power supply system, a DC/AC converter circuit configured to convert an input-side DC voltage into an AC voltage, a control circuit, connected to the DC/AC converter circuit, configured to deliver a predefined flow of power via the DC input of the PV inverter, a current sensor configured to detect a generator current ($I_{PV}$) at the DC input, a voltage sensor configured to detect a generator voltage ($U_{PV}$) at the DC input, an evaluation circuit connected to the current sensor and the voltage sensor, wherein the PV inverter is configured to:
  operate a PV generator of the PV installation at a maximum power point (MPP) with values of generator voltage ($U_{MPP}$) and generator current ($I_{MPP}$) associated with the maximum power point (MPP), operate the PV generator of the PV installation at a first generator voltage ($U_1$) and detection of a first generator current ($I_1$) associated with the first generator voltage ($U_1$), operate the PV generator of the PV installation additionally at a second generator voltage ($U_2$) and detection of a second generator current ($I_2$) associated with the second generator voltage ($U_2$), operate the PV generator of the PV installation additionally at a third generator voltage ($U_3$), and detection of a third generator current ($I_3$) associated with the third generator voltage ($U_3$), wherein the first generator voltage ($U_1$) dictates that a first power ($P_1$), with $P_1=U_1*I_1$, of the PV generator at the first generator voltage ($U_1$) is in a predefined first ratio ($V_1$), with $V_1=P_1/P_{MPP}$ and $V_1 \leq 1$, with the power ($P_{MPP}$) at the maximum power point (MPP) of the PV generator, and wherein the second generator voltage ($U_2$) dictates that a second power ($P_2$), with $P_2=U_2*I_2$, of the PV generator at the second generator voltage ($U_2$) is in a predefined second ratio ($V_2$), with $V_2=P_2/P_1$ and $V_2<1$, with the first power ($P_1$) of the PV generator, wherein the third generator voltage ($U_3$) dictates that a third power ($P_3$), with $P_3=U_3*I_3$, of the PV generator at the third generator voltage ($U_3$) is in a predefined third ratio ($V_3$), with $V_3=P_3/P_1$ and $V_3<1$, with the first power ($P_1$) of the PV generator, and a relationship in the form ($U_3<U_1<U_2$) or a relationship in the form ($U_2<U_1<U_3$) applies to the generator voltages ($U_1$, $U_2$, $U_3$) in accordance with their values, and wherein a characteristic quantity Y that characterizes a progress of the potential-induced degradation (PID) is determined from a sixth parameter ($W_6$) that takes into consideration a second gradient $m_2=(I_1-I_3)/(U_1-U_3)$, a first gradient $m_1=(I_2-I_1)/(U_2-U_1)$, or a ratio of the first and second gradients $m_1/m_2$ within the IU graph.

* * * * *